United States Patent
Yano et al.

(10) Patent No.: US 9,201,717 B2
(45) Date of Patent: Dec. 1, 2015

(54) MEMORY SYSTEM

(71) Applicant: KABUSHIKI KAISHA TOSHIBA, Minato-ku (JP)

(72) Inventors: Junji Yano, Kanagawa (JP); Hidenori Matsuzaki, Tokyo (JP); Kosuke Hatsuda, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/199,808

(22) Filed: Mar. 6, 2014

(65) Prior Publication Data

US 2014/0189420 A1 Jul. 3, 2014

Related U.S. Application Data

(63) Continuation of application No. 12/394,875, filed on Feb. 27, 2009, now Pat. No. 8,706,950.

(30) Foreign Application Priority Data

| Mar. 1, 2008 | (JP) | ................................ | 2008-051467 |
| Mar. 11, 2008 | (JP) | ................................ | 2008-061346 |

(51) Int. Cl.
*G06F 12/16* (2006.01)
*G06F 11/07* (2006.01)
(Continued)

(52) U.S. Cl.
CPC .......... *G06F 11/073* (2013.01); *G06F 12/0246* (2013.01); *G06F 12/0804* (2013.01); *G06F 12/0866* (2013.01); *G11C 29/88* (2013.01); *G06F 2212/1032* (2013.01); *G06F 2212/7202* (2013.01); *G11C 2029/0409* (2013.01); *G11C 2029/0411* (2013.01)

(58) Field of Classification Search
None
See application file for complete search history.

(56) References Cited

U.S. PATENT DOCUMENTS

| 7,173,863 B2 | 2/2007 | Conley et al. |
| 7,523,013 B2 | 4/2009 | Gorobets et al. |

(Continued)

FOREIGN PATENT DOCUMENTS

| JP | 64-64047 | 3/1989 |
| JP | 6-202950 | 7/1994 |

(Continued)

OTHER PUBLICATIONS

Japanese Decision of a Patent Grant issued Sep. 27, 2010, in Patent Application No. 2008-051467 (with English-language translation).

(Continued)

*Primary Examiner* — Gary Portka
(74) *Attorney, Agent, or Firm* — Oblon, McClelland, Maier & Neustadt, L.L.P.

(57) ABSTRACT

A memory system includes a volatile first storing unit, a nonvolatile second storing unit in which data is managed in a predetermined unit, and a controller that writes data requested by a host apparatus in the second storing unit via the first storing unit and reads out data requested by the host apparatus from the second storing unit to the first storing unit and transfers the data to the host apparatus. The controller includes a management table for managing the number of failure areas in a predetermined unit that occur in the second storing unit and switches, according to the number of failure areas, an operation mode in writing data in the second storing unit from the host apparatus.

47 Claims, 28 Drawing Sheets

(51) Int. Cl.
 *G06F 12/02* (2006.01)
 *G06F 12/08* (2006.01)
 *G11C 29/00* (2006.01)
 *G11C 29/04* (2006.01)

(56) References Cited

U.S. PATENT DOCUMENTS

| | | |
|---|---|---|
| 7,861,122 B2 | 12/2010 | Cornwell et al. |
| 8,032,698 B2 | 10/2011 | Nam |
| 2003/0225961 A1 | 12/2003 | Chow et al. |
| 2008/0215911 A1 | 9/2008 | Chang |
| 2008/0294938 A1* | 11/2008 | Kondo .......................... 714/24 |

FOREIGN PATENT DOCUMENTS

| | | |
|---|---|---|
| JP | 6-309232 | 11/1994 |
| JP | 6-314172 | 11/1994 |
| JP | 7-271668 | 10/1995 |
| JP | 8-328959 | 12/1996 |
| JP | 10-269143 | 10/1998 |
| JP | 2000-66843 | 3/2000 |
| JP | 2001-134487 | 5/2001 |
| JP | 2001-167002 | 6/2001 |
| JP | 2002-259119 | 9/2002 |
| JP | 2002-358169 | 12/2002 |
| JP | 3472008 | 9/2003 |
| JP | 3688835 | 6/2005 |
| JP | 2007-505406 | 3/2007 |
| JP | 2007-193414 | 8/2007 |
| JP | 2007-528079 | 10/2007 |
| JP | 2010-521014 | 6/2010 |
| WO | WO 2005/088456 | 9/2005 |

OTHER PUBLICATIONS

Office Action issued Aug. 13, 2010, in Japan Patent Application No. 2008-061346.

* cited by examiner

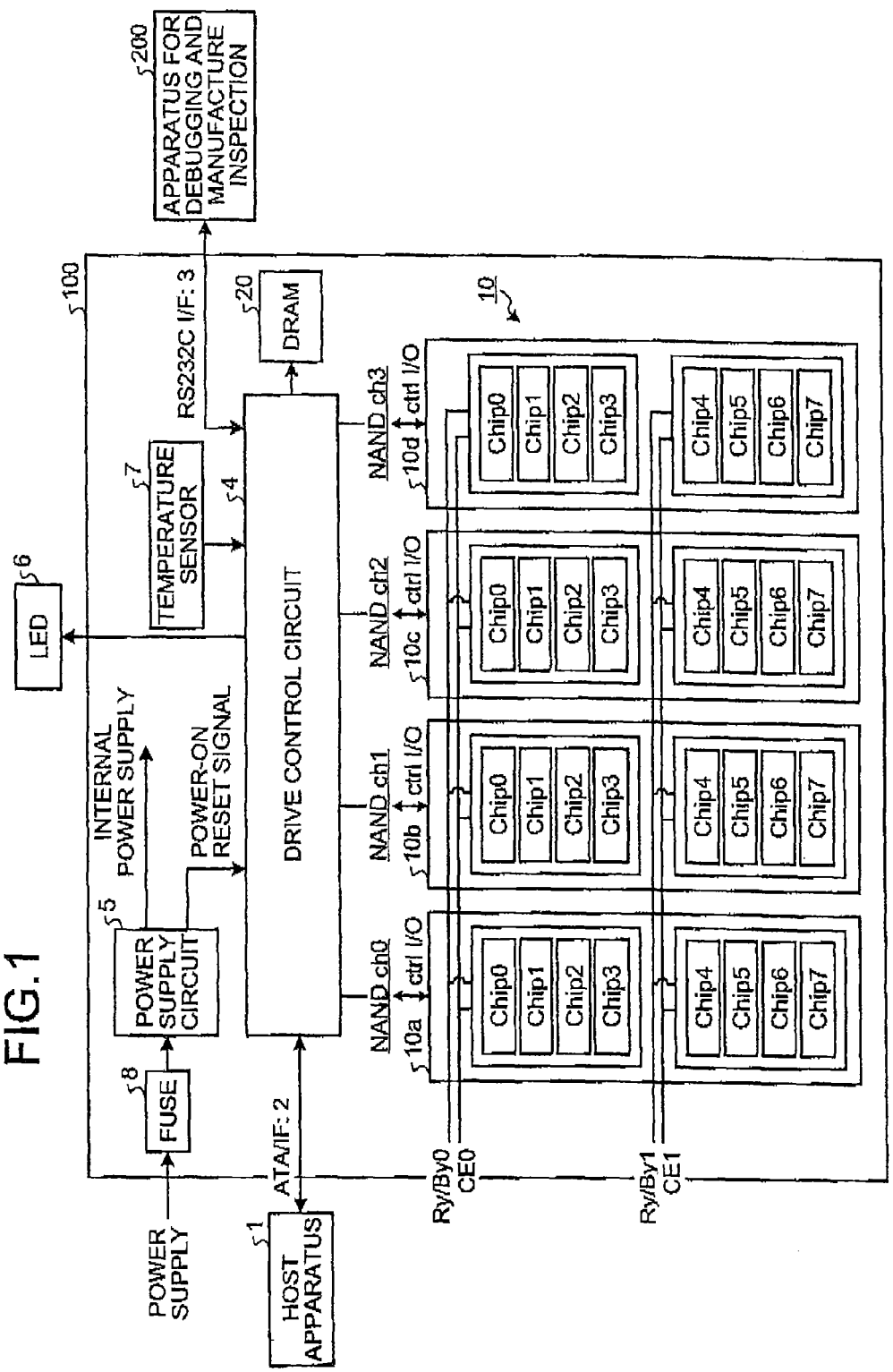

FIG.9

| | way 1 | | way n |
|---|---|---|---|
| Line 1 | STATE FLAG+LOGICAL TRACK ADDRESS | | ... |
| ⋮ | ⋮ | | ⋮ |
| Line m | STATE FLAG+LOGICAL TRACK ADDRESS | | ... |

| | way 1 (25a) | | way n |
|---|---|---|---|
| Line 1 | STATE FLAG+SECTOR POSITION BITMAP+LOGICAL TRACK ADDRESS | | ... |
| Line 2 | 25b　...　25c | | ... |
| ⋮ | ⋮ | | ⋮ |
| Line m | ... | | ... |

FIG.13
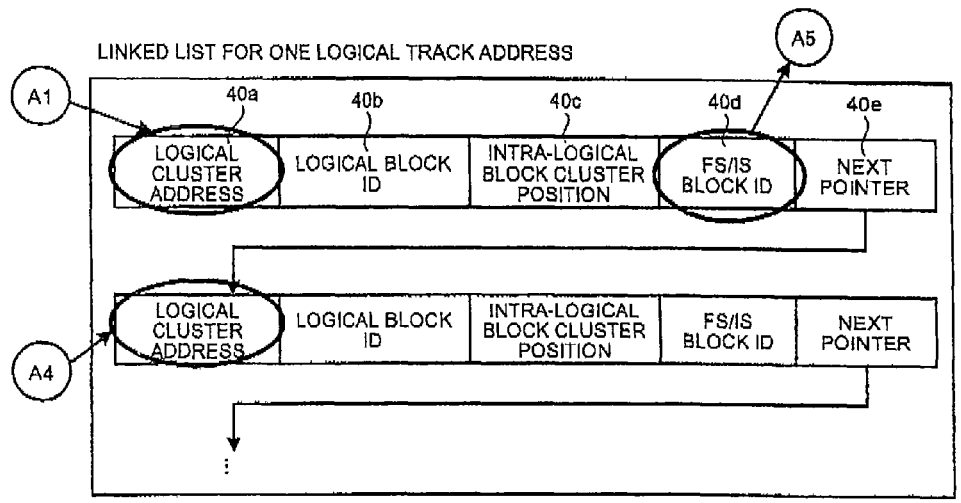
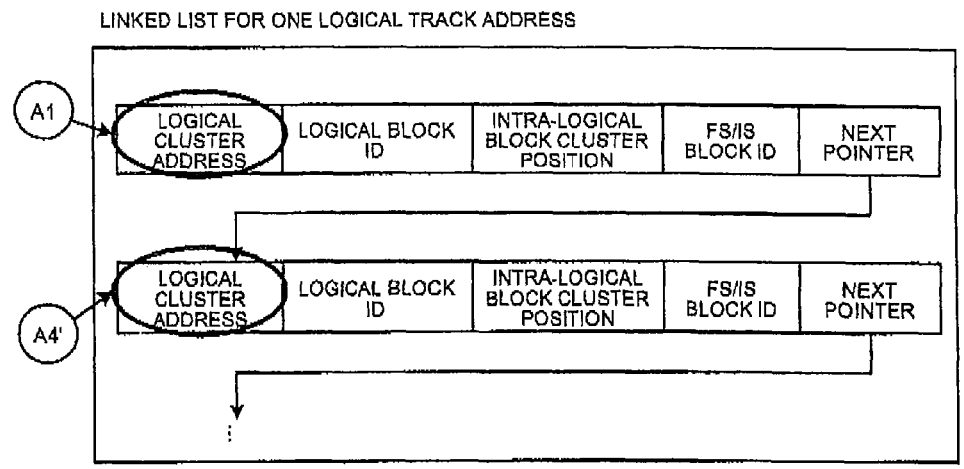

FIG.14

| LOGICAL BLOCK ID | TRACK MANAGEMENT POINTER (FOR $2^i$ TRACKS) | NUMBER OF VALID TRACKS | WRITABLE TOP TRACK | VALID |
|---|---|---|---|---|
| BLOCK 0 | ... | ... | ... | ... |
| BLOCK 3 | ... | ... | ... | ... |
| ⋮ | ⋮ | ⋮ | ⋮ | ⋮ |
| BLOCK m | ... | ... | ... | ... |

FIG.17

| LOGICAL BLOCK ID | PHYSICAL BLOCK ID×8 | NUMBER OF TIMES OF ERASING | NUMBER OF TIMES OF READOUT |
|---|---|---|---|
| ⋮ | ⋮ | ⋮ | ⋮ |
| ⋮ | ⋮ | ⋮ | ⋮ |
| ⋮ | ⋮ | ⋮ | ⋮ |
| ⋮ | ⋮ | ⋮ | ⋮ |

50a — LOGICAL BLOCK ID
50b — PHYSICAL BLOCK ID×8
50c — NUMBER OF TIMES OF ERASING
50d — NUMBER OF TIMES OF READOUT

FIG.20

| TO<br>FROM | WC | FS | IS | MS |
|---|---|---|---|---|
| WC | N/A | CLUSTER FLUSH | N/A | TRACK FLUSH AND PASSIVE MERGE |
| FS | N/A | CLUSTER PADDING | (BLOCK FLUSH) | TRACK FLUSH AND PASSIVE MERGE |
| IS | N/A | CLUSTER PADDING | IS COMPACTION | TRACK FLUSH AND PASSIVE MERGE |
| MS | N/A | CLUSTER PADDING | N/A | TRACK PADDING MS COMPACTION |

FIG.22

| channel 0 | | channel 1 | | channel 2 | | channel 3 | |
|---|---|---|---|---|---|---|---|
| plane 0 | plane 1 | plane 0 | plane 1 | plane 0 | plane 1 | plane 0 | plane 1 |
| ID#0 | ID#1 | ID#2 | ID#3 | ID#4 | ID#5 | ID#6 | ID#7 |
| PHYSICAL BLOCK ID | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ |
| ... | ... | ... | ... | ... | ... | ... | ... |

BAD CLUSTER TABLE 90

| CLUSTER ADDRESS (90a) | SECTOR BITMAP (90b) |
|---|---|
| Addr0 | 0000···1000 |
| Addr1 | 0000···0000 |
| ⋮ | ⋮ |
| Addr ($2^k$-1) | 0000···0000 |

MEMORY SYSTEM

CROSS-REFERENCE TO RELATED APPLICATIONS

This application is a continuation of U.S. application Ser. No. 12/394,875 filed Feb. 27, 2009, and is based upon and claims the benefit of priority from the prior Japanese Patent Application No. 2008-61346, filed on Mar. 11, 2008, and Japanese Patent Application No. 2008-051467, filed on Mar. 1, 2008, the entire contents of each of which are incorporated herein by reference.

BACKGROUND OF THE INVENTION

1. Field of the Invention

The present invention relates to a memory system including a nonvolatile semiconductor memory.

2. Description of the Related Art

As an external storage device used in a computer system, an SSD (Solid State Drive) mounted with a nonvolatile semiconductor memory such as a NAND-type flash memory attracts attention. The flash memory has advantages such as high speed and light weight compared with a magnetic disk device.

The SSD includes a plurality of flash memory chips, a controller that performs read/write control for the respective flash memory chips in response to a request from a host apparatus, a buffer memory for performing data transfer between the respective flash memory chips and the host apparatus, a power supply circuit, and a connection interface to the host apparatus (e.g., Japanese Patent No. 3688835).

Examples of the nonvolatile semiconductor memory include nonvolatile semiconductor memories in which a unit of erasing, writing, and readout is fixed such as a nonvolatile semiconductor memory that, in storing data, once erases the data in block units and then performs writing and a nonvolatile semiconductor memory that performs writing and readout in page units in the same manner as the NAND-type flash memory.

On the other hand, a unit for a host apparatus such as a personal computer to write data in and read out the data from a secondary storage device such as a hard disk is called sector. The sector is set independently from a unit of erasing, writing, and readout of a semiconductor storage device.

For example, whereas a size of a block (a block size) of the nonvolatile semiconductor memory is 512 kB and a size of a page (a page size) thereof is 4 kB, a size of a sector (a sector size) of the host apparatus is set to 512 B.

In this way, the unit of erasing, writing, and readout of the nonvolatile semiconductor memory may be larger than the unit of writing and readout of the host apparatus.

As the SSD, an SSD configured to interpose a cache memory between a flash memory and a host apparatus and read out data from the flash memory at high speed is disclosed (see, for example, Published Translation of International Publication No. 2007-528079). In a memory system including such a cache memory, if the cache memory is full when a data write request is generated, data is flushed from the cache memory to the flash memory and then data is written in the cache memory.

BRIEF SUMMARY OF THE INVENTION

A memory system according to an embodiment of the present invention comprises:

a first storage area functioning as a write cache included in a volatile semiconductor memory storage element from which data can be read out and to which data can be written in a unit equal to or smaller than a sector unit;

a second storage area functioning as a read cache included in a volatile semiconductor memory storage element from which data is read out and to which data is writ equal to or smaller than the sector unit;

a third storage area included in a nonvolatile semiconductor memory storage element from which data is read out and to which data is written in a page unit and in which data is erased in a block unit twice or larger natural number times as large as the page unit; and a controller that stores, when a data writing request is received from a host apparatus, data transferred from the host apparatus in the first storage area, transfers, when the stored data satisfies a predetermined condition, the data to the third storage area as data in a first management unit having a size natural number times as large as the sector unit, transfers, when the stored data does not satisfy the predetermined condition, the data to the third storage area as data in a second management unit having a size twice or larger natural number times as large as the first management unit, and reads out, when a data readout request is received from the host apparatus, requested data from the third storage area and transfers the data to the host apparatus via the second storage area, wherein the controller includes a first management table for managing, as a first failure area number, a number of failure areas in the first management unit that occur in the third storage area, and the controller switches, according to the first failure area number, an operation mode in processing at least one of the data writing request and the data readout request from the host apparatus from a first operation mode to a second operation mode.

BRIEF DESCRIPTION OF THE DRAWINGS

FIG. 1 is a block diagram of a configuration example of an SSD;

FIG. 9 is a diagram of an example of an RC cluster management table;

FIG. 10 is a diagram of an example of a WC cluster management table;

FIG. 13 is a diagram of an example of an FS/IS management table;

FIG. 14 is a diagram of an example of an MS logical block management table;

FIG. 17 is a diagram of an example of a logical-to-physical translation table;

FIG. 20 is a diagram of combinations of inputs and outputs in a flow of data among components and causes of the flow;

FIG. 22 is a diagram of an example of a BB management table;

FIG. 23 is a diagram of an example of a bad cluster table;

DETAILED DESCRIPTION OF THE INVENTION

Figure 2A:
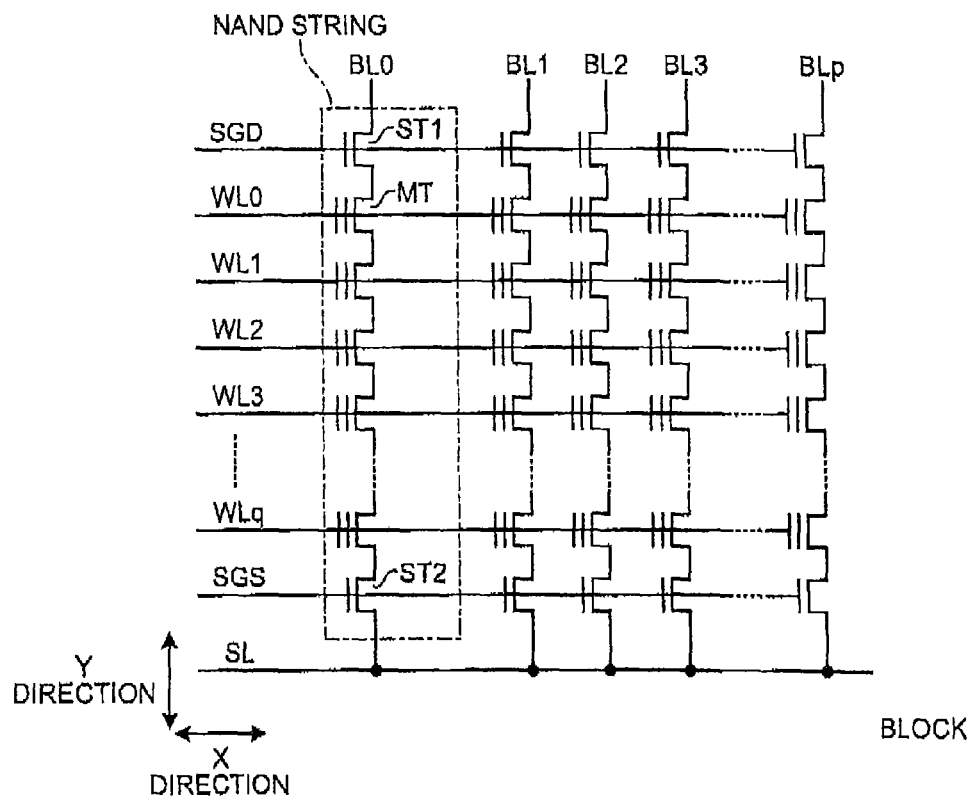
FIG. 2A is a circuit diagram of a configuration example of one physical block included in the NAND memory.

Embodiments of the present invention are explained below with reference to the accompanying drawings. In the following explanation, components having the same functions and configurations are denoted by the same reference numerals and signs. Redundant explanation of the components is made only when necessary.

Embodiments

Embodiments of the present invention are explained below with reference to the drawings. In the following explanation, components having the same functions and configurations are denoted by the same reference numerals and signs. Redundant explanation of the components is performed only when necessary.

First, terms used in this specification are defined.

Physical page: A unit that can be collectively written and read out in a NAND memory chip. A physical page size is, for example, 4 kB. However, a redundant bit such as an error correction code added to main data (user data, etc.) in an SSD is not included. Usually, 4 kB+redundant bit (e.g., several 10 B) is a unit simultaneously written in a memory cell. However, for convenience of explanation, the physical page is defined as explained above.

Logical page: A writing and readout unit set in the SSD. The logical page is associated with one or more physical pages. A logical page size is, for example, 4 kB in an 8-bit normal mode and is 32 kB in a 32-bit double speed mode. However, a redundant bit is not included.

Physical block: A minimum unit that can be independently erased in the NAND memory chip. The physical block includes a plurality of physical pages. A physical block size is, for example, 512 kB. However, a redundant bit such as an error correction code added to main data in the SSD is not included. Usually, 512 kB+redundant bit (e.g., several 10 kB) is a unit simultaneously erased. However, for convenience of explanation, the physical block is defined as explained above.

Logical block: An erasing unit set in the SSD. The logical block is associated with one or more physical blocks. A logical block size is, for example, 512 kB in an 8-bit normal mode and is 4 MB in a 32-bit double speed mode. However, a redundant bit is not included.

Sector: A minimum access unit from a host. A sector size is, for example, 512 B.

Cluster: A management unit for managing "small data (fine grained data)" in the SSD. A cluster size is equal to or larger than the sector size, and for example, is set such that a size twice or larger natural number times as large as the cluster size is the logical page size. The cluster size can be set to be equal to a data management unit of a file system adopted by an operating system (OS) on a host side or can be set to be equal to the logical page size.

Track: A management unit for managing "large data (coarse grained data)" in the SSD. A track size is set such that a size twice or larger natural number times as large as the cluster size is the track size, and for example, a size twice or larger natural number times as large as the track size is the logical block size. The track size can be set to be equal to the logical block size to simplify data management.

Free block (FB): A logical block on a NAND-type flash memory for which a use is not allocated. When a use is allocated to the free block, the free block is used after being erased.

Bad block (BB): A physical block on the NAND-type flash memory that cannot be used as a storage area because of a large number of errors. For example, a physical block for which an erasing operation is not normally finished is registered as the bad block BB.

Writing efficiency: A statistical value of an erasing amount of the logical block with respect to a data amount written from the host in a predetermined period. As the writing efficiency is smaller, a wear degree of the NAND-type flash memory is smaller.

Valid cluster: A cluster that stores latest data corresponding to a logical address.

Invalid cluster: A cluster that stores non-latest data not to be referred as a result that a cluster having identical logical address is written in other storage area.

Valid track: A track that stores latest data corresponding to a logical address.

Invalid track: A track that stores non-latest data not to be referred as a result that a cluster having identical logical address is written in other storage area.

Compaction: Extracting only the valid cluster and the valid track from a logical block in the management object and rewriting the valid cluster and the valid track in a new logical block.

First Embodiment

FIG. 1 is a block diagram of a configuration example of an SSD (Solid State Drive) 100. The SSD 100 is connected to a host apparatus 1 such as a personal computer or a CPU core via a memory connection interface such as an ATA interface (ATA I/F) 2 and functions as an external storage of the host apparatus 1. The SSD 100 can transmit data to and receive data from an apparatus for debugging and manufacture inspection 200 via a communication interface 3 such as an RS232C interface (RS232C I/F). The SSD 100 includes a NAND-type flash memory (hereinafter abbreviated as NAND memory) 10 as a nonvolatile semiconductor memory, a drive control circuit 4 as a controller, a DRAM 20 as a volatile semiconductor memory, a power supply circuit 5, an LED for state display 6, a temperature sensor 7 that detects the temperature in a drive, and a fuse 8.

The power supply circuit 5 generates a plurality of different internal DC power supply voltages from external DC power supplied from a power supply circuit on the host apparatus 1 side and supplies these internal DC power supply voltages to respective circuits in the SSD 100. The power supply circuit 5 detects a rising edge of an external power supply, generates a power-on reset signal, and supplies the power-on reset signal to the drive control circuit 4. The fuse 8 is provided between the power supply circuit on the host apparatus 1 side and the power supply circuit 5 in the SSD 100. When an overcurrent is supplied from an external power supply circuit, the fuse 8 is disconnected to prevent malfunction of the internal circuits.

The NAND memory 10 has four parallel operation elements 10a to 10d that perform four parallel operations. One parallel operation element has two NAND memory packages. Each of the NAND memory packages includes a plurality of stacked NAND memory chips (e.g., 1 chip=2 GB). In the case of FIG. 1, each of the NAND memory packages includes stacked four NAND memory chips. The NAND memory 10 has a capacity of 64 GB. When each of the NAND memory packages includes stacked eight NAND memory chips, the NAND memory 10 has a capacity of 128 GB.

The DRAM 20 functions as a cache for data transfer between the host apparatus 1 and the NAND memory 10 and a memory for a work area. An FeRAM (Ferroelectric Random Access Memory), PRAM (Phase-change Random Access Memory), or MRAM (Magnetoresistive Random Access Memory) can be used instead of the DRAM 20. The drive control circuit 4 performs data transfer control between the host apparatus 1 and the NAND memory 10 via the DRAM 20 and controls the respective components in the SSD 100. The drive control circuit 4 supplies a signal for status display to the LED for state display 6. The drive control circuit 4 also has a function of receiving a power-on reset signal from the power supply circuit 5 and supplying a reset signal and a clock signal to respective units in the own circuit and the SSD 100.

Each of the NAND memory chips is configured by arraying a plurality of physical blocks as units of data erasing. FIG. 2A is a circuit diagram of a configuration example of one physical block included in the NAND memory chip. Each physical block includes (p+1) NAND strings arrayed in order along an X direction (p is an integer equal to or larger than 0). A drain of a selection transistor ST1 included in each of the (p+1) NAND strings is connected to bit lines BL0 to BLp and a gate thereof is connected to a selection gate line SGD in common. A source of a selection transistor ST2 is connected to a source line SL in common and a gate thereof is connected to a selection gate line SGS in common.

Each of memory cell transistors MT includes a MOSFET (Metal Oxide Semiconductor Field Effect Transistor) including the stacked gate structure formed on a semiconductor substrate. The stacked gate structure includes a charge storage layer (a floating gate electrode) formed on the semiconductor substrate via a gate insulating film and a control gate electrode formed on the charge storage layer via an inter-gate insulating film. Threshold voltage changes according to the number of electrons accumulated in the floating gate electrode. The memory cell transistor MT stores data according to a difference in the threshold voltage. The memory cell transistor MT can be configured to store one bit or can be configured to store multiple values (data equal to or larger than two bits).

The memory cell transistor MT is not limited to the structure having the floating gate electrode and can be the structure such as a MONOS (Metal-Oxide-Nitride-Oxide-Silicon) type that can adjust a threshold by causing a nitride film interface as a charge storage layer to trap electrons. Similarly, the memory cell transistor MT of the MONOS structure can be configured to store one bit or can be configured to store multiple values (data equal to or larger than two bits).

In each of the NAND strings, (q+1) memory cell transistors MT are arranged between the source of the selection transistor ST1 and the drain of the selection transistor ST2 such that current paths thereof are connected in series. In other words, the memory cell transistors MT are connected in series in a Y direction such that adjacent ones of the memory cell transistors MT share a diffusion region (a source region or a drain region).

Control gate electrodes of the memory cell transistors MT are connected to word lines WL0 to WLq, respectively, in order from the memory cell transistor MT located on the most drain side. Therefore, a drain of the memory cell transistor MT connected to the word line WL0 is connected to the source of the selection transistor ST1. A source of the memory cell transistor MT connected to the word line WLq is connected to the drain of the selection transistor ST2.

The word lines WL0 to WLq connect the control gate electrodes of the memory cell transistors MT in common among the NAND strings in the physical block. In other words, the control gates of the memory cell transistors MT present in an identical row in the block are connected to an identical word line WL. (p+1) memory cell transistors MT connected to the identical word line WL is treated as one page (physical page). Data writing and data readout are performed by each physical page.

The bit lines BL0 to BLp connect drains of selection transistors ST1 in common among the blocks. In other words, the NAND strings present in an identical column in a plurality of blocks are connected to an identical bit line BL.

Figure 2B:
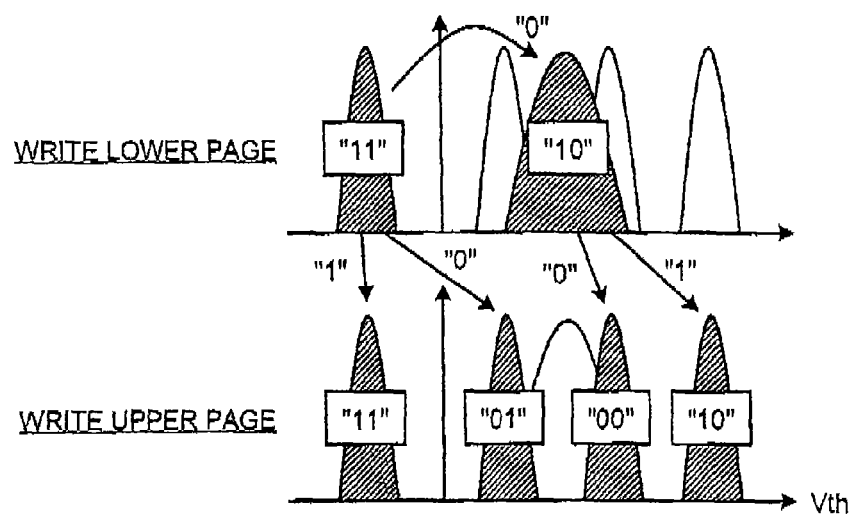
FIG. 2B is a schematic diagram of a threshold distribution in a quaternary data storage mode for storing two bits in one memory cell transistor MT.

FIG. 2B is a schematic diagram of a threshold distribution, for example, in a quaternary data storage mode for storing two bits in one memory cell transistor MT. In the quaternary data storage mode, any one of quaternary data "xy" defined by upper page data "x" and lower page data "y" can be stored in the memory cell transistor MT.

As the quaternary data "xy", for example, "11", "01", "00", and "10" are allocated in order of threshold voltages of the memory cell transistor MT. The data "11" is an erased state in which the threshold voltage of the memory cell transistor MT is negative.

In a lower page writing operation, the data "10" is selectively written in the memory cell transistor MT having the data "11" (in the erased state) according to the writing of the lower bit data "y". A threshold distribution of the data "10" before upper page writing is located about in the middle of threshold distributions of the data "01" and the data "00" after the upper page writing and can be broader than a threshold distribution after the upper page writing. In a upper page writing operation, writing of upper bit data "x" is selectively applied to a memory cell of the data "11" and a memory cell of the data "10". The data "01" and the data "00" are written in the memory cells.

Figure 3:
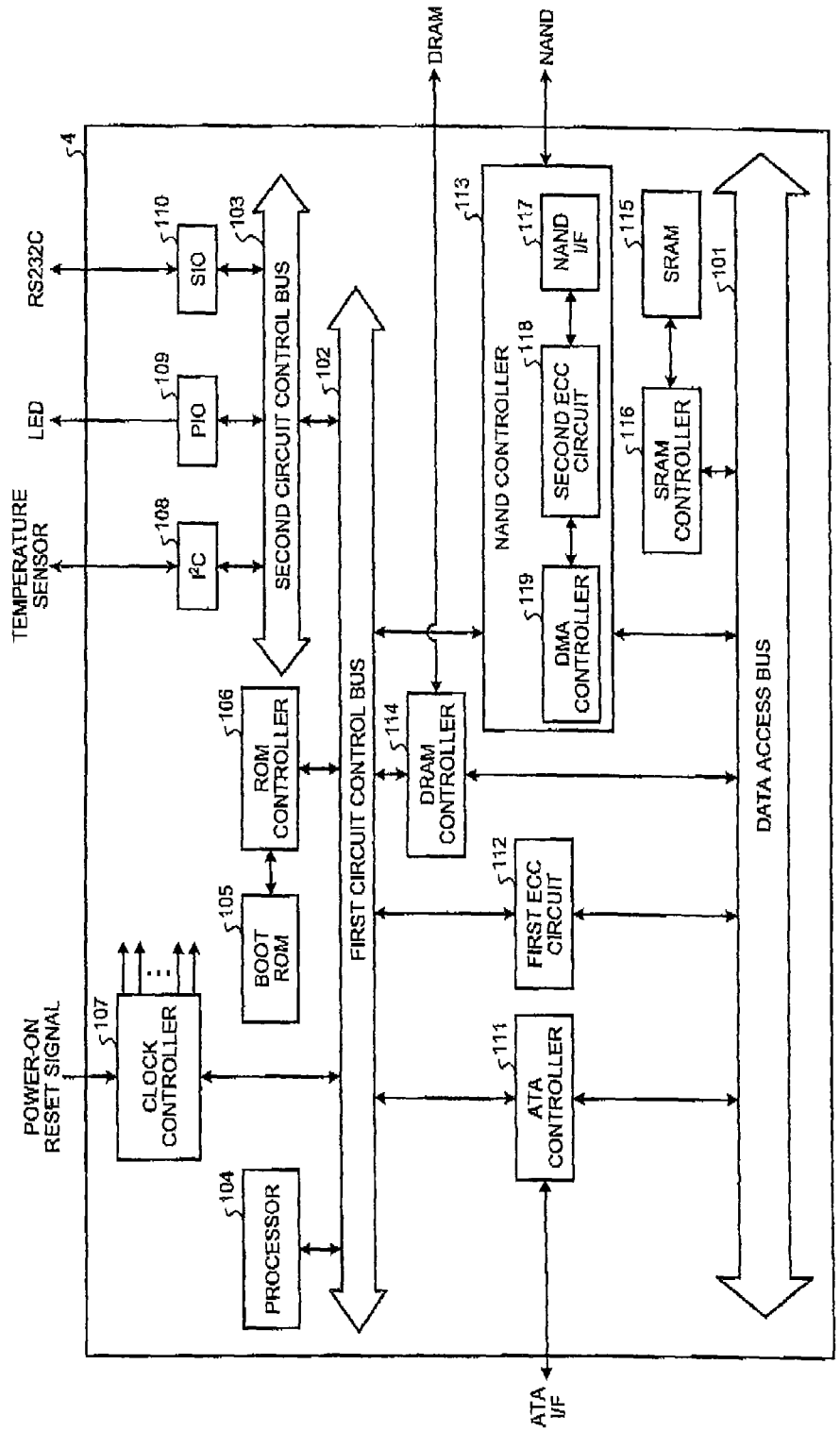
FIG. 3 is a block diagram of a hardware internal configuration example of a drive control circuit.

FIG. 3 is a block diagram of a hardware internal configuration example of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105, in which a boot program for booting respective management programs (FW: firmware) stored in the NAND memory 10 is stored, is connected to the first circuit control bus 102 via a ROM controller 106. A clock controller 107 that receives the power-on rest signal from the power supply circuit 5 shown in FIG. 1 and supplies a reset signal and a clock signal to the respective units is connected to the first circuit control bus 102.

The second circuit control bus 103 is connected to the first circuit control bus 102. An I²C circuit 108 for receiving data from the temperature sensor 7 shown in FIG. 1, a parallel IO (PIO) circuit 109 that supplies a signal for status display to the LED for state display 6, and a serial IO (SIO) circuit 110 that controls the RS232C I/F 3 are connected to the second circuit control bus 103.

An ATA interface controller (ATA controller) 111, a first ECC (Error Checking and Correction) circuit 112, a NAND controller 113, and a DRAM controller 114 are connected to both the data access bus 101 and the first circuit control bus 102. The ATA controller 111 transmits data to and receives data from the host apparatus 1 via the ATA interface 2. An SRAM 115 used as a data work area and a firm ware expansion area is connected to the data access bus 101 via an SRAM controller 116. When the firmware stored in the NAND memory 10 is started, the firmware is transferred to the SRAM 115 by the boot program stored in the boot ROM 105.

The NAND controller 113 includes a NAND I/F 117 that performs interface processing for interface with the NAND memory 10, a second ECC circuit 118, and a DMA controller for DMA transfer control 119 that performs access control between the NAND memory 10 and the DRAM 20. The second ECC circuit 118 performs encode of a second correction code and performs encode and decode of a first error correction code. The first ECC circuit 112 performs decode of a second error correction code. The first error correction code and the second error correction code are, for example, a hamming code, a BCH (Bose Chaudhuri Hoccienghem) code, an RS (Reed Solomon) code, or an LDPC (Low Density Parity Check) code. Correction ability of the second error correction code is higher than correction ability of the first error correction code.

As shown in FIGS. 1 and 3, in the NAND memory 10, the four parallel operation elements 10a to 10d are connected in parallel to the NAND controller 112 in the drive control circuit 4 via four eight-bit channels (4 ch). Three kinds of access modes explained below are provided according to a combination of whether the four parallel operation elements 10a to 10d are independently actuated or actuated in parallel and whether a double speed mode (Multi Page Program/Multi Page Read/Multi Block Erase) provided in the NAND memory chip is used.

(1) 8-Bit Normal Mode

An 8-bit normal mode is a mode for actuating only one channel and performing data transfer in 8-bit units. Writing and readout are performed in the physical page size (4 kB). Erasing is performed in the physical block size (512 kB). One logical block is associated with one physical block and a logical block size is 512 kB.

(2) 32-Bit Normal Mode

A 32-bit normal mode is a mode for actuating four channels in parallel and performing data transfer in 32-bit units. Writing and readout are performed in the physical page size×4 (16 kB). Erasing is performed in the physical block size×4 (2 MB). One logical block is associated with four physical blocks and a logical block size is 2 MB.

(3) 32-Bit Double Speed Mode

A 32-bit double speed mode is a mode for actuating four channels in parallel and performing writing and readout using a double speed mode of the NAND memory chip. Writing and readout are performed in the physical page size×4×2 (32 kB). Erasing is performed in the physical block size×4×2 (4 MB). One logical block is associated with eight physical blocks and a logical block size is 4 MB.

In the 32-bit normal mode or the 32-bit double speed mode for actuating four channels in parallel, four or eight physical blocks operating in parallel are erasing units for the NAND memory 10 and four or eight physical pages operating in parallel are writing units and readout units for the NAND memory 10. In operations explained below, basically, the 32-bit double speed mode is used. For example, it is assumed that one logical block=4 MB=$2^i$ tracks=$2^j$ pages=$2^k$ clusters=$2^l$ sectors (i, j, k, and l are natural numbers and a relation of i<j<k<l holds).

A logical block accessed in the 32-bit double speed mode is accessed in 4 MB units. Eight (2×4ch) physical blocks (one physical block=512 kB) are associated with the logical block. When the bad block BB managed in physical block units is detected, the bad block BB is unusable. Therefore, in such a case, a combination of the eight physical blocks associated with the logical block is changed to not include the bad block BB.

Figure 4:
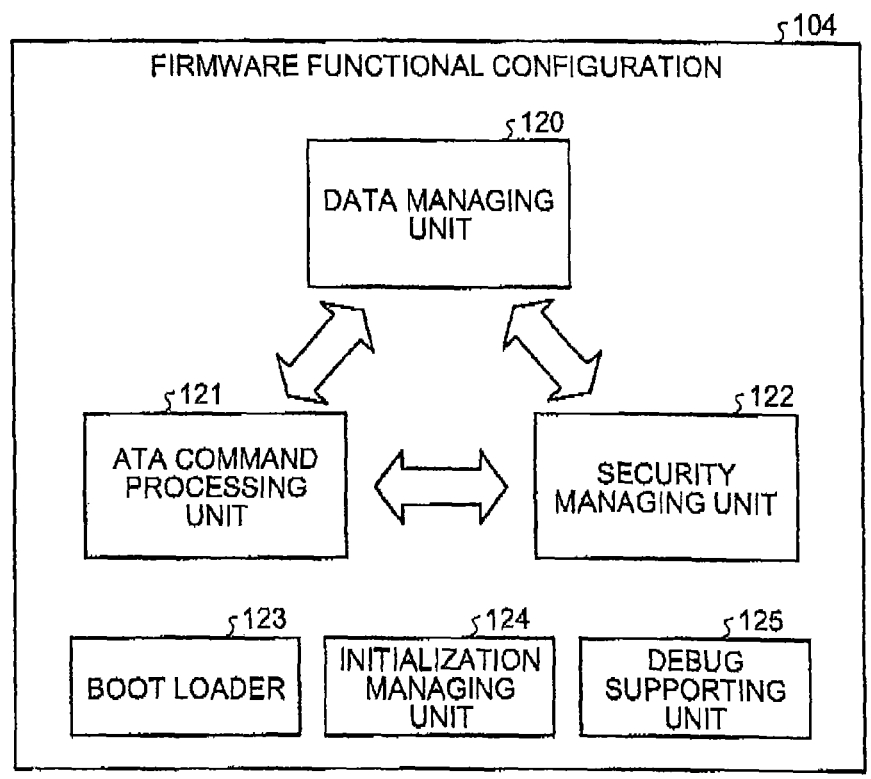
FIG. 4 is a block diagram of a functional configuration example of a processor.

FIG. 4 is a block diagram of a functional configuration example of firmware realized by the processor 104. Functions of the firmware realized by the processor 104 are roughly classified into a data managing unit 120, an ATA-command processing unit 121, a security managing unit 122, a boot loader 123, an initialization managing unit 124, and a debug supporting unit 125.

The data managing unit 120 controls data transfer between the NAND memory 10 and the DRAM 20 and various functions concerning the NAND memory 10 via the NAND controller 112 and the first ECC circuit 114. The ATA-command processing unit 121 performs data transfer processing between the DRAM 20 and the host apparatus 1 in cooperation with the data managing unit 120 via the ATA controller 110 and the DRAM controller 113. The security managing unit 122 manages various kinds of security information in cooperation with the data managing unit 120 and the ATA-command processing unit 121.

The boot loader 123 loads, when a power supply is turned on, the management programs (firmware) from the NAND memory 10 to the SRAM 120. The initialization managing unit 124 performs initialization of respective controllers and circuits in the drive control circuit 4. The debug supporting unit 125 processes data for debug supplied from the outside via the RS232C interface. The data managing unit 120, the ATA-command processing unit 121, and the security managing unit 122 are mainly functional units realized by the processor 104 executing the management programs stored in the SRAM 114.

In this embodiment, functions realized by the data managing unit 120 are mainly explained. The data managing unit 120 performs, for example, provision of functions that the ATA-command processing unit 121 requests the NAND memory 10 and the DRAM 20 as storage devices to provide (in response to various commands such as a Write request, a Cache Flush request, and a Read request from the host apparatus), management of a correspondence relation between a host address region and the NAND memory 10 and protection of management information, provision of fast and highly efficient data readout and writing functions using the DRAM 20 and the NAND 10, ensuring of reliability of the NAND memory 10.

Figure 5:
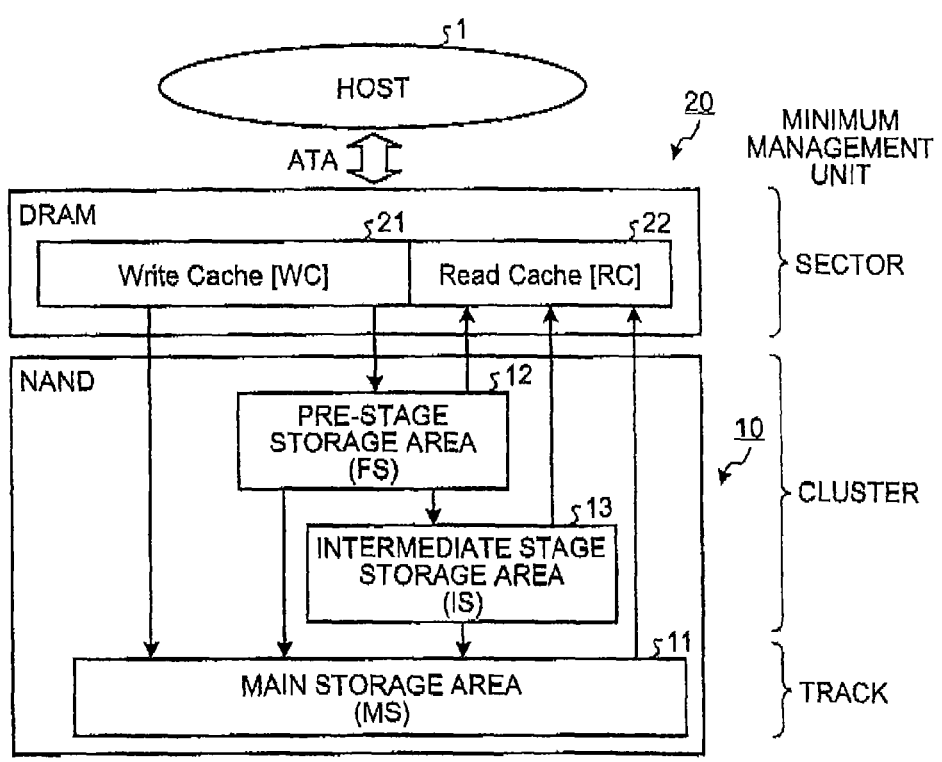
FIG. 5 is a block diagram of a functional configuration formed in a NAND memory and a DRAM.

FIG. 5 is a diagram of functional blocks formed in the NAND memory 10 and the DRAM 20. A write cache (WC) 21 and a read cache (RC) 22 configured on the DRAM 20 are interposed between the host 1 and the NAND memory 10. The WC 21 temporarily stores Write data from the host apparatus 1. The RC 22 temporarily stores Read data from the NAND memory 10. The WC 21 and the RC 22 may be configured on different DRAM chips or other kind of memory chips described above.

The logical blocks in the NAND memory 10 are allocated to respective management areas of a pre-stage storage area (FS: Front Storage) 12, an intermediate stage storage area (IS: Intermediate Storage) 13, and a main storage area (MS: Main Storage) 11 by the data managing unit 120 in order to reduce an amount of erasing for the NAND memory 10 during writing. The FS 12 manages data from the WC 21 in cluster units, i.e., "small units" and stores small data (fine grained data) for a short period. The IS 13 manages data overflowing from the FS 12 in cluster units, i.e., "small units" and stores small data (fine grained data) for a long period. The MS 11 stores data from the WC 21, the FS 12, and the IS 13 in track units, i.e., "large units" and stores large data (coarse grained data) for a long period. For example, storage capacities are in a relation of MS>IS and FS>WC.

When the small management unit is applied to all the storage areas of the NAND memory 10, a size of a management table explained later is enlarged and does not fit in the DRAM 20. Therefore, the respective storages of the NAND memory 10 are configured to manage, in small management units, only data just written recently and small data with low efficiency of writing in the NAND memory 10. The techniques using the "small units" together with the "large units" in the SSD 100 are described in the International Application No. PCT2008/JP/073950, the entire contents of which are incorporated herein by reference.

Figure 6:
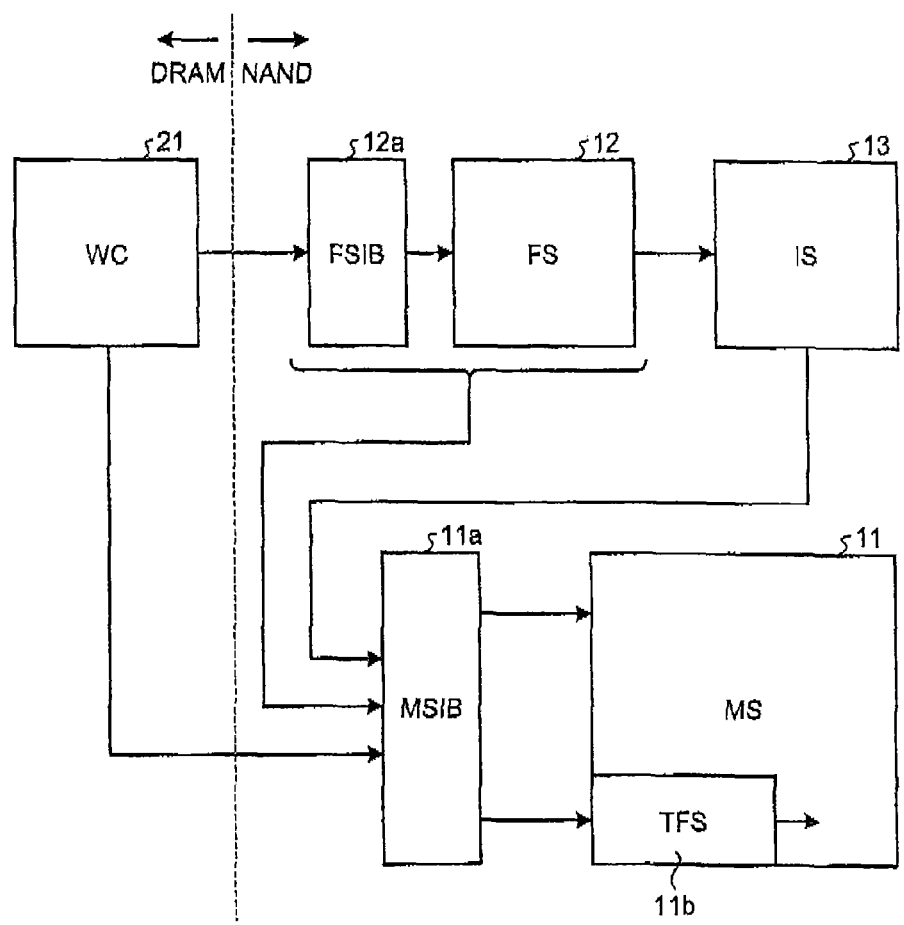
FIG. 6 is a detailed functional block diagram related to write processing from a WC to the NAND memory.

FIG. 6 is a more detailed functional block diagram related to write processing (WR processing) from the WC 21 to the NAND memory 10. An FS input buffer (FSIB) 12$a$ that buffers data from the WC 21 is provided at a pre-stage of the FS 12. An MS input buffer (MSIB) 11$a$ that buffers data from the WC 21, the FS 12, or the IS 13 is provided at a pre-stage of the MS 11. A track pre-stage storage area (TFS) 11$b$ is provided in the MS 11. The TFS 11$b$ is a buffer that has the FIFO (First in First out) structure interposed between the MSIB 11$a$ and the MS 11. Data recorded in the TFS 11$b$ is data with an update frequency higher than that of data recorded in the MS 11. Any of the logical blocks in the NAND memory 10 is allocated to the MS 11, the MSIB 11$a$, the TFS 11$b$, the FS 12, the FSIB 12$a$, and the IS 13.

Figure 7:
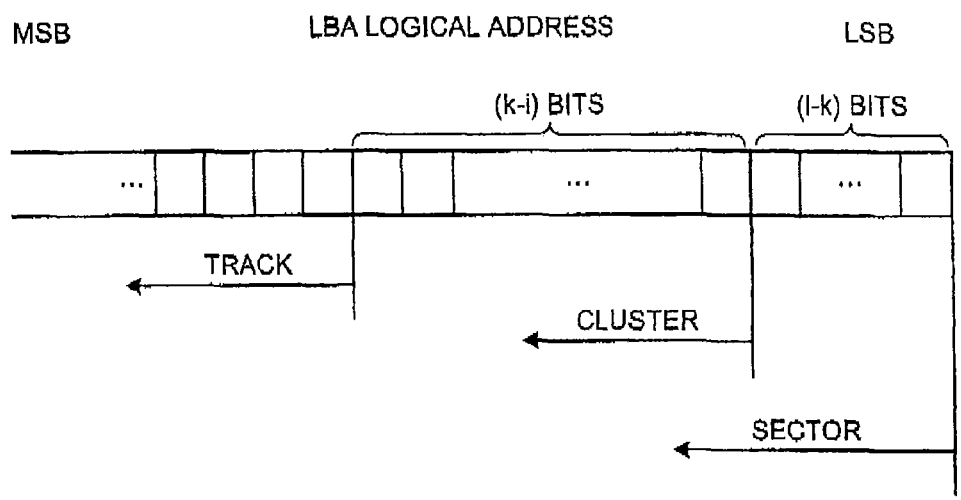
FIG. 7 is a diagram of an LBA logical address.

Specific functional configurations of the respective components shown in FIGS. 5 and 6 are explained in detail. When the host apparatus 1 performs Read or Write for the SSD 100, the host apparatus 1 inputs LBA (Logical Block Addressing) as a logical address via the ATA interface. As shown in FIG. 7, the LBA is a logical address in which serial numbers from 0 are attached to sectors (size: 512 B). In this embodiment, as management units for the WC 21, the RC 22, the FS 12, the IS 13, and the MS 11, which are the components shown in FIG. 5, a logical cluster address formed of a bit string equal to or higher in order than a low-order (l−k+1)th bit of the LBA and a logical track address formed of bit strings equal to or higher in order than a low-order (l−i+1)th bit of the LBA are defined. One cluster=$2^{(l-k)}$ sectors and one track=$2^{(k-i)}$ clusters. Read cache (RC) 22

The RC 22 is explained. The RC 22 is an area for temporarily storing, in response to a Read request from the ATA-command processing unit 121, Read data from the NAND memory 10 (the FS 12, the IS 13, and the MS 11). In this embodiment, the RC 22 is managed in, for example, an m-line/n-way (m is a natural number equal to or larger than $2^{(k-i)}$ and n is a natural number equal to or larger than 2) set associative system and can store data for one cluster in one entry. A line is determined by LSB (k−i) bits of the logical cluster address. The RC 22 can be managed in a full-associative system or can be managed in a simple FIFO system.

Write Cache (WC) 21

The WC 21 is explained. The WC 21 is an area for temporarily storing, in response to a Write request from the ATA-command processing unit 121, Write data from the host apparatus 1. The WC 21 is managed in the m-line/n-way (m is a natural number equal to or larger than $2^{(k-i)}$ and n is a natural number equal to or larger than 2) set associative system and can store data for one cluster in one entry. A line is determined by LSB (k−i) bits of the logical cluster address. For example, a writable way is searched in order from a way 1 to a way n. Tracks registered in the WC 21 are managed in LRU (Least Recently Used) by the FIFO structure of a WC track management table 24 explained later such that the order of earliest update is known. The WC 21 can be managed by the full-associative system. The WC 21 can be different from the RC 22 in the number of lines and the number of ways.

Data written according to the Write request is once stored on the WC 21. A method of determining data to be flushed from the WC 21 to the NAND 10 complies with rules explained below.

(i) When a writable way in a line determined by a tag is a last (in this embodiment, nth) free way, i.e., when the last free way is used, a track updated earliest based on an LRU among tracks registered in the line is decided to be flushed.

(ii) When the number of different tracks registered in the WC 21 exceeds a predetermined permissible number, tracks with the numbers of clusters smaller than a predetermined number in a WC are decided to be flushed in order of LRUs.

Tracks to be flushed are determined according to the policies explained above. In flushing the tracks, all data included in an identical track is flushed. When an amount of data to be flushed exceeds, for example, 50% of a track size, the data is flushed to the MS 11. When an amount of data to be flushed does not exceed, for example, 50% of a track size, the data is flushed to the FS 12.

When track flush is performed under the condition (i) and the data is flushed to the MS 11, a track satisfying a condition that an amount of data to be flushed exceeds 50% of a track size among the tracks in the WC 21 is selected and added to flush candidates according to the policy (i) until the number of tracks to be flushed reaches $2^i$ (when the number of tracks is equal to or larger than $2^i$ from the beginning, until the number of tracks reaches $2^{i+1}$). In other words, when the number of tracks to be flushed is smaller than $2^i$, tracks having valid clusters more than $2^{(k-i-1)}$ are selected in order from the oldest track in the WC and added to the flush candidates until the number of tracks reaches $2^i$.

When track flush is performed under the condition (i) and the track is flushed to the FS 12, a track satisfying the condition that an amount of data to be flushed does not exceed 50% of a track size is selected in order of LRUs among the tracks in the WC 21 and clusters of the track are added to the flush candidates until the number of clusters to be flushed reaches $2^k$. In other words, clusters are extracted from tracks having $2^{(k-i-1)}$ or less valid clusters by tracing the tracks in the WC in order from the oldest one and, when the number of valid clusters reaches $2^k$, the clusters are flushed to the FSIB 12$a$ in logical block units. However, when $2^k$ valid clusters are not found, clusters are flushed to the FSIB 12$a$ in logical page units. A threshold of the number of valid clusters for determining whether the flush to the FS 12 is performed in logical block units or logical page units is not limited to a value for one logical block, i.e., $2^k$ and can be a value slightly smaller than the value for one logical block.

In a Cache Flush request from the ATA-command processing unit 121, all contents of the WC 21 are flushed to the FS 12 or the MS 11 under conditions same as the above (when an amount of data to be flushed exceeds 50% of a track size, the data is flushed to the MS 11 and, when the amount of data does not exceed 50%, the data is flushed to the FS 12).

Pre-Stage Storage Area (FS) 12

The FS 12 is explained. The FS 12 adapts an FIFO structure of logical block units in which data is managed in cluster units. The FS 12 is a buffer for regarding that data passing through the FS 12 has an update frequency higher than that of the IS 13 at the post stage. In other words, in the FIFO structure of the FS 12, a valid cluster (a latest cluster) passing through the FIFO is invalidated when rewriting in the same address from the host is performed. Therefore, the cluster passing through the FS 12 can be regarded as having an update frequency higher than that of a cluster flushed from the FS 12 to the IS 13 or the MS 11.

By providing the FS 12, likelihood of mixing of data with a high update frequency in compaction processing in the IS 13 at the post stage is reduced. When the number of valid clusters of a logical block is reduced to 0 by the invalidation, the logical block is released and allocated to the free block FB. When the logical block in the FS 12 is invalidated, a new free block FB is acquired and allocated to the FS 12.

When cluster flush from the WC 21 to the FS 12 is performed, the cluster is written in a logical block allocated to the FSIB 12a. When logical blocks, for which writing of all logical pages is completed, are present in the FSIB 12a, the logical blocks are moved from the FSIB 12a to the FS 12 by CIB processing explained later. In moving the logical blocks from the FSIB 12a to the FS 12, when the number of logical blocks of the FS 12 exceeds a predetermined upper limit value allowed for the FS 12, an oldest logical block is flushed from the FS 12 to the IS 13 or the MS 11. For example, a track with a ratio of valid clusters in the track equal to or larger than 50% is written in the MS 11 (the TFS 11b) and a logical block in which the valid cluster remains is moved to the IS 13.

As the data movement between components in the NAND memory 10, there are two ways, i.e., Move and Copy. Move is a method of simply performing relocation of a pointer of a management table explained later and not performing actual rewriting of data. Copy is a method of actually rewriting data stored in one component to the other component in page units, track units, or block units.

Intermediate Stage Storage Area (IS) 13

The IS 13 is explained. In the IS 13, management of data is performed in cluster units in the same manner as the FS 12. Data stored in the IS 13 can be regarded as data with a low update frequency. When movement (Move) of a logical block from the FS 12 to the IS 13, i.e., flush of the logical block from the FS 12 is performed, a logical block as an flush object, which is previously a management object of the FS 12, is changed to a management object of the IS 13 by the relocation of the pointer. According to the movement of the logical block from the FS 12 to the IS 13, when the number of blocks of the IS 13 exceeds a predetermined upper limit value allowed for the IS 13, i.e., when the number of writable free blocks FB in the IS decreases to be smaller than a threshold, data flush from the IS 13 to the MS 11 and compaction processing are executed. The number of blocks of the IS 13 is returned to a specified value.

The IS 13 executes flush processing and compaction processing explained below using the number of valid clusters in a track.

Tracks are sorted in order of the number of valid clusters× valid cluster coefficient (the number weighted according to whether a track is present in a logical block in which an invalid track is present in the MS 11; the number is larger when the invalid track is present than when the invalid track is not present). $2^{i+1}$ tracks (for two logical blocks) with a large value of a product are collected, increased to be natural number times as large as a logical block size, and flushed to the MSIB 11a.

When a total number of valid clusters of two logical blocks with a smallest number of valid clusters is, for example, equal to or larger than $2^k$ (for one logical block), which is a predetermined set value, the step explained above is repeated (to perform the step until a free block FB can be created from two logical blocks in the IS).

$2^k$ clusters are collected in order from logical blocks with a smallest number of valid clusters and compaction is performed in the IS.

Here, the two logical blocks with the smallest number of valid clusters are selected. However, the number is not limited to two and only has to be a number equal to or larger than two. The predetermined set value only has to be equal to or smaller than the number of clusters that can be stored in the number of logical blocks smaller than the number of selected logical blocks by one.

Main Storage Area (MS) 11

The MS 11 is explained. In the MS 11, management of data is performed in track units. Data stored in the MS 11 can be regarded as having a low update frequency. When Copy or Move of track from the WC 21, the FS 12, or the IS 13 to the MS 11 is performed, the track is written in a logical block allocated to the MSIB 11a. On the other hand, when only data (clusters) in a part of the track is written from the WC 21, the FS 12, or the IS 13, track padding explained later for merging existing track in the MS 11 and flushed data to create new track and, then, writing the created track in the MSIB 11a is performed. When invalid tracks are accumulated in the MS 11 and the number of logical blocks allocated to the MS 11 exceeds the upper limit of the number of blocks allowed for the MS 11, compaction processing is performed to create a free block FB.

As the compaction processing of the MS 11, for example, a method explained below with attention paid to only the number of valid tracks in a logical block is carried out.

Logical blocks are selected from one with a smallest number of valid tracks until a free block FB can be created by combining invalid tracks.

Compaction is executed for tracks stored in the selected logical blocks. The compaction involves passive merge explained later for collecting clusters in the WC 21, the FS 12, and the IS 13 and merging with the tracks stored in the selected logical blocks.

A logical block in which $2^i$ tracks can be integrated is output to the TFS 11b ($2^i$ track MS compaction) and tracks smaller in number than $2^i$ are output to the MSIB 11a (less than $2^i$ track compaction) to create a larger number of free blocks FB.

The TFS 11b adapts an FIFO structure of logical block units in which data is managed in track units. The TFS 11b is a buffer for regarding that data passing through the TFS 11b has an update frequency higher than that of the MS 11 at the post stage. In other words, in the FIFO structure of the TFS 11b, a valid track (a latest track) passing through the FIFO is invalidated when rewriting in the same address from the host is performed. Therefore, a track passing through the TFS 11b can be regarded as having an update frequency higher than that of a track flushed from the TFS 11b to the MS 11. When the track is equal to the logical block size, the compaction processing in the MS 11 is unnecessary. It is unnecessary to set the storage area used as the TFS 11*b*.

Figure 8:
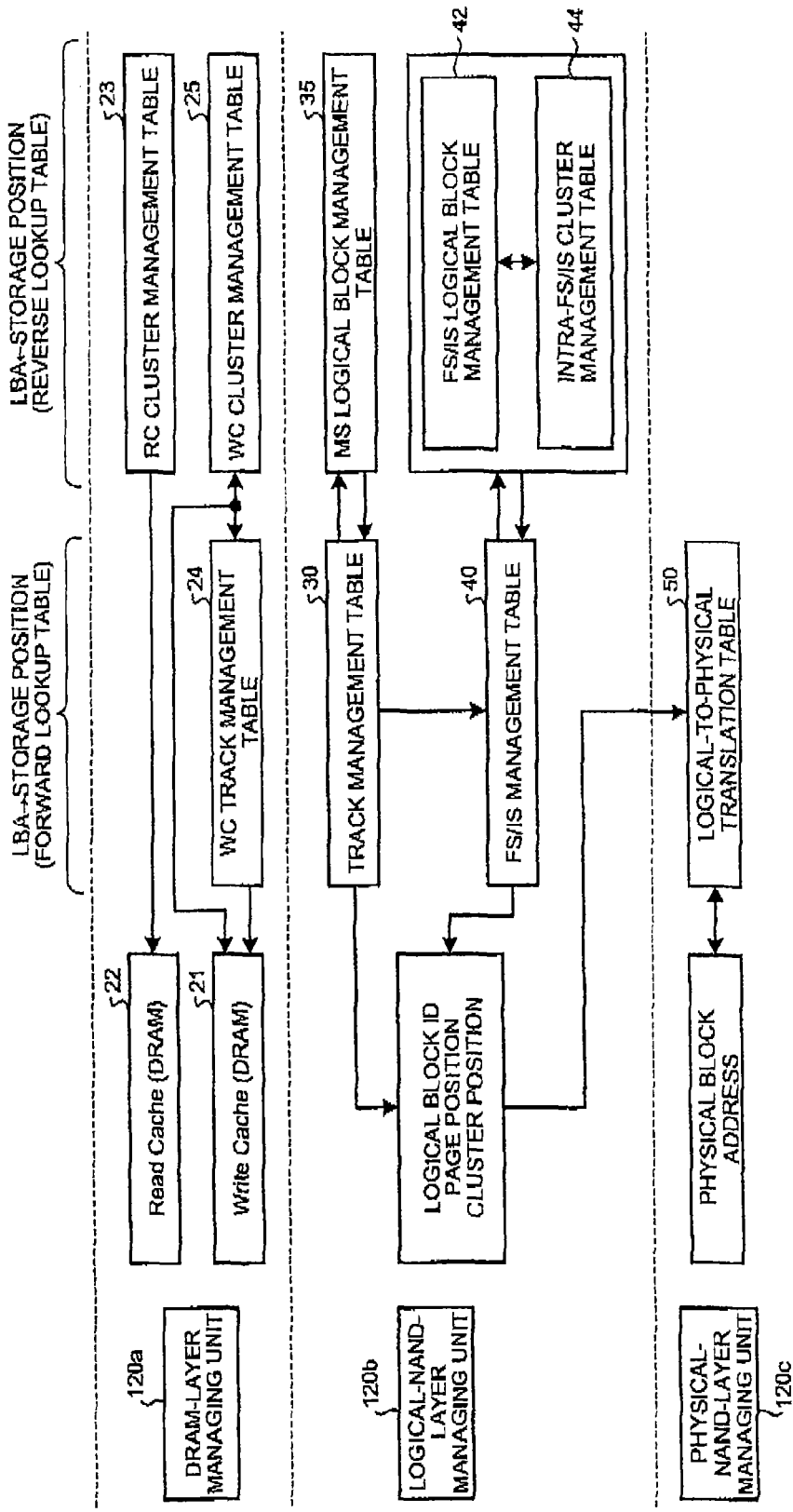
FIG. 8 is a diagram of a configuration example of a management table in a data managing unit.

FIG. 8 is a diagram of a management table for the data managing unit 120 to control and manage the respective components shown in FIGS. 5 and 6. The data managing unit 120 has, as explained above, the function of bridging the ATA-command processing unit 121 and the NAND memory 10 and includes a DRAM-layer managing unit 120*a* that performs management of data stored in the DRAM 20, a logical-NAND-layer managing unit 120*b* that performs management of data stored in the NAND memory 10, and a physical-NAND-layer managing unit 120*c* that manages the NAND memory 10 as a physical storage device. An RC cluster management table 23, a WC track management table 24, and a WC cluster management table 25 are controlled by the DRAM-layer managing unit 120*a*. A track management table 30, an FS/IS management table 40, an MS logical block management table 35, an FS/IS logical block management table 42, and an intra-FS/IS cluster management table 44 are managed by the logical-NAND-layer managing unit 120*b*. A logical-to-physical translation table 50 is managed by the physical-NAND-layer managing unit 120*c*.

The RC 22 is managed by the RC cluster management table 23, which is a reverse lookup table. In the reverse lookup table, from a position of a storage device, a logical address stored in the position can be searched. The WC 21 is managed by the WC cluster management table 25, which is a reverse lookup table, and the WC track management table 24, which is a forward lookup table. In the forward lookup table, from a logical address, a position of a storage device in which data corresponding to the logical address is present can be searched.

Logical addresses of the FS 12 (the FSIB 12*a*), the IS 13, and the MS 11 (the TFS 11*b* and the MSIB 11*a*) in the NAND memory 10 are managed by the track management table 30, the FS/IS management table 40, the MS logical block management table 35, the FS/IS logical block management table 42, and the intra-FS/IS cluster management table 44. In the FS 12 (the FSIB 12*a*), the IS 13, and the MS 11 (the TFS 11*b* and MSIB 11*a*) in the NAND memory 10, conversion of a logical address and a physical address is performed of the logical-to-physical translation table 50. These management tables are stored in an area on the NAND memory 10 and read onto the DRAM 20 from the NAND memory 10 during initialization of the SSD 100.

RC Cluster Management Table 23 (Reverse Lookup)

The RC cluster management table 23 is explained with reference to FIG. 9. As explained above, the RC 22 is managed in the n-way set associative system indexed by logical cluster address LSB (k–i) bits. The RC cluster management table 23 is a table for managing tags of respective entries of the RC (the cluster size×m-line×n-way) 22. Each of the tags includes a state flag 23*a* including a plurality of bits and a logical track address 23*b*. The state flag 23*a* includes, besides a valid bit indicating whether the entry may be used (valid/invalid), for example, a bit indicating whether the entry is on a wait for readout from the NAND memory 10 and a bit indicating whether the entry is on a wait for readout to the ATA-command processing unit 121. The RC cluster management table 23 functions as a reverse lookup table for searching for a logical track address coinciding with LBA from a tag storage position on the DRAM 20.

WC Cluster Management Table 25 (Reverse Lookup)

The WC cluster management table 25 is explained with reference to FIG. 10. As explained above, the WC 21 is managed in the n-way set associative system indexed by logical cluster address LSB (k–i) bits. The WC cluster management table 25 is a table for managing tags of respective entries of the WC (the cluster size×m-line×n-way) 21. Each of the tags includes a state flag 25*a* of a plurality of bits, a sector position bitmap 25*b*, and a logical track address 25*c*.

The state flag 25*a* includes, besides a valid bit indicating whether the entry may be used (valid/invalid), for example, a bit indicating whether the entry is on a wait for flush to the NAND memory 10 and a bit indicating whether the entry is on a wait for writing from the ATA-command processing unit 121. The sector position bitmap 25*b* indicates which of $2^{(l-k)}$ sectors included in one cluster stores valid data by expanding the sectors into $2^{(l-k)}$ bits. With the sector position bitmap 25*b*, management in sector units same as the LBA can be performed in the WC 21. The WC cluster management table 25 functions as a reverse lookup table for searching for a logical track address coinciding with the LBA from a tag storage position on the DRAM 20.

WC Track Management Table 24 (Forward Lookup)

Figure 11:
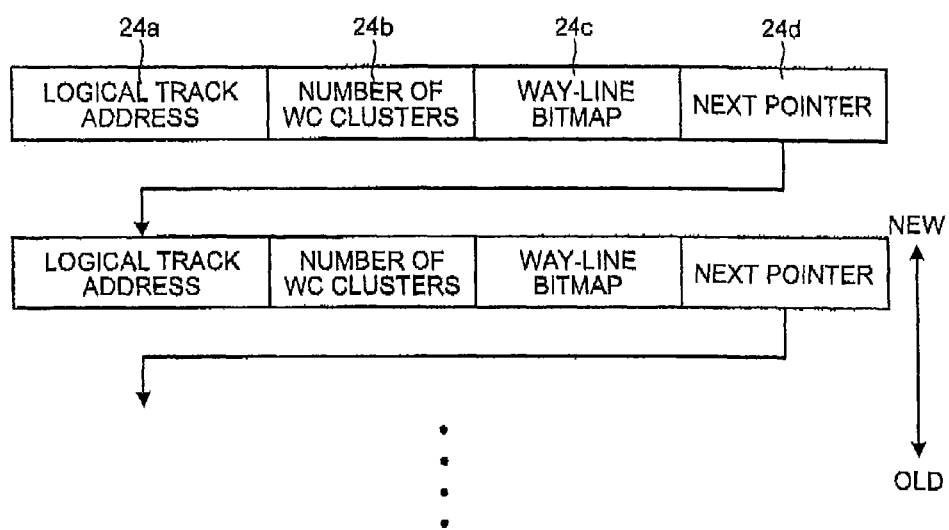
FIG. 11 is a diagram of an example of a WC track management table.

The WC track management table 24 is explained with reference to FIG. 11. The WC track management table 24 is a table for managing information in which clusters stored on the WC 21 are collected in track units and represents the order (LRU) of registration in the WC 21 among the tracks using the linked list structure having an FIFO-like function. The LRU can be represented by the order updated last in the WC 21. An entry of each list includes a logical track address 24*a*, the number of valid clusters 24*b* in the WC 21 included in the logical track address, a way-line bitmap 24*c*, and a next pointer 24*d* indicating a pointer to the next entry. The WC track management table 24 functions as a forward lookup table because required information is obtained from the logical track address 24*a*.

The way-line bitmap 24*c* is map information indicating in which of m×n entries in the WC 21 a valid cluster included in the logical track address in the WC 21 is stored. The Valid bit is "1" in an entry in which the valid cluster is stored. The way-line bitmap 24*c* includes, for example, (one bit (valid)+$\log_2$ n bits (n-way))×m bits (m-line). The WC track management table 24 has the linked list structure. Only information concerning the logical track address present in the WC 21 is entered.

Track Management Table 30 (Forward Lookup)

Figure 12:
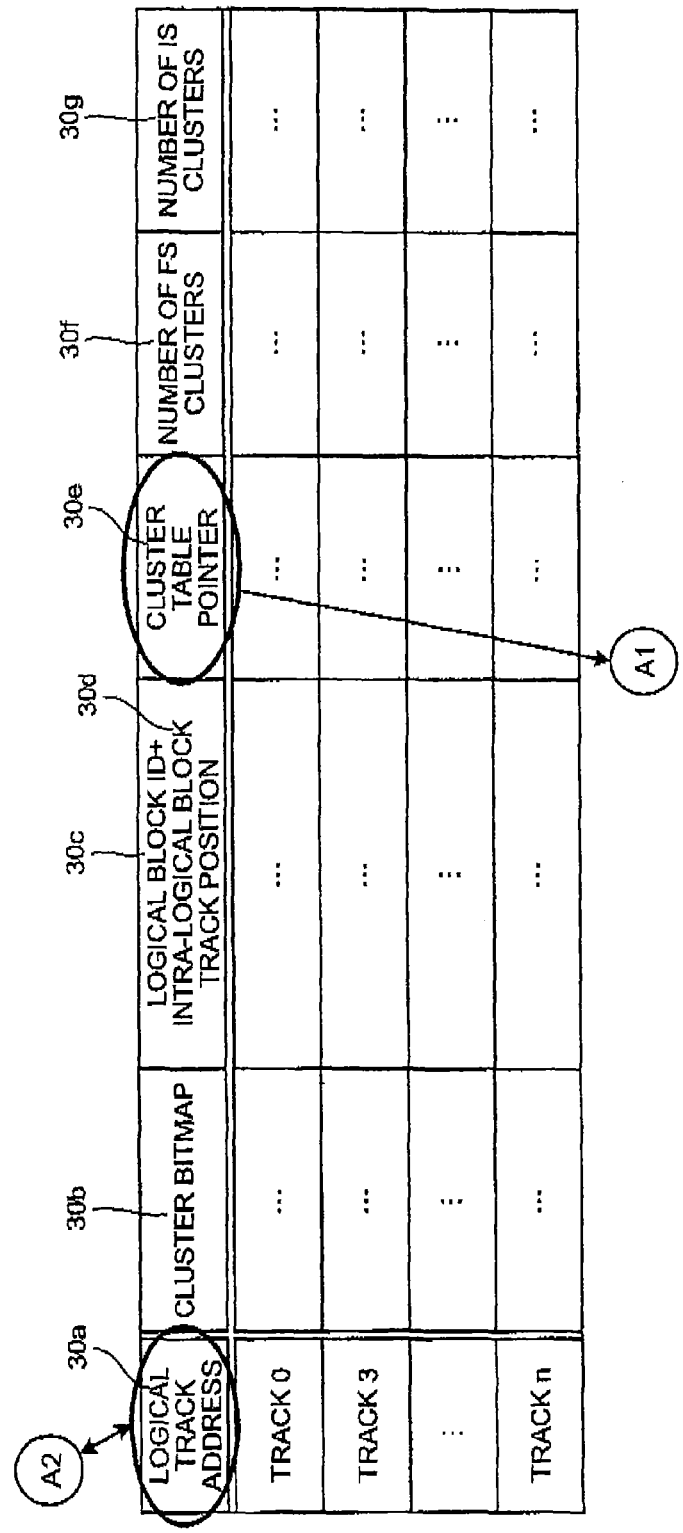
FIG. 12 is a diagram of an example of a track management table.

The track management table 30 is explained with reference to FIG. 12. The track management table 30 is a table for managing a logical data position on the MS 11 in logical track address units. When data is stored in the FS 12 or the IS 13 in cluster units, the track management table 30 stores basic information concerning the data and a pointer to detailed information. The track management table 30 is configured in an array format having a logical track address 30*a* as an index. Each entry having the logical track address 30*a* as an index includes information such as a cluster bitmap 30*b*, a logical block ID 30*c*+ an intra-logical block track position 30*d*, a cluster table pointer 30*e*, the number of FS clusters 30*f*, and the number of IS clusters 30*g*. The track management table 30 functions as a forward lookup table because, using a logical track address as an index, required information such as a logical block ID (corresponding to a storage device position) in which track corresponding to the logical track address is stored.

The cluster bitmap 30*b* is a bitmap obtained by dividing $2^{(k-i)}$ clusters belonging to one logical track address range into, for example, eight in ascending order of logical cluster addresses. Each of eight bits indicates whether clusters corresponding to $2^{(k-i-3)}$ cluster addresses are present in the MS 11 or present in the FS 12 or the IS 13. When the bit is "0", this indicates that the clusters as search objects are surely present in the MS 11. When the bit is "1", this indicates that the clusters are likely to be present in the FS 12 or the IS 13.

The logical block ID 30c is information for identifying a logical block ID in which track corresponding to the logical track address is stored. The intra-logical block track position 30d indicates a storage position of a track corresponding to the logical track address (30a) in the logical block designated by the logical block ID 30c. Because one logical block includes maximum $2^i$ valid tracks, the intra-logical block track position 30d identifies $2^i$ track positions using i bits.

The cluster table pointer 30e is a pointer to a top entry of each list of the FS/IS management table 40 having the linked list structure. In the search through the cluster bitmap 30b, when it is indicated that the cluster is likely to be present in the FS 12 or the IS 13, search through the FS/IS management table 40 is executed by using the cluster table pointer 30e. The number of FS clusters 30f indicates the number of valid clusters present in the FS 12. The number of IS clusters 30g indicates the number of valid clusters present in the IS 13.

FS/IS Management Table 40 (Forward Lookup)

The FS/IS management table 40 is explained with reference to FIG. 13. The FS/IS management table 40 is a table for managing a position of data stored in the FS 12 (including the FSIB 12a) or the IS 13 in logical cluster addresses. As shown in FIG. 13, the FS/IS management table 40 is formed in an independent linked list format for each logical track address. As explained above, a pointer to a top entry of each list is stored in a field of the cluster table pointer 30e of the track management table 30. In FIG. 13, linked lists for two logical track addresses are shown. Each entry includes a logical cluster address 40a, a logical block ID 40b, an intra-logical block cluster position 40c, an FS/IS block ID 40d, and a next pointer 40e. The FS/IS management table 40 functions as a forward lookup table because required information such as the logical block ID 40b and the intra-logical block cluster position 40c (corresponding to a storage device position) in which cluster corresponding to the logical cluster address 40a is stored is obtained from the logical cluster address 40a.

The logical block ID 40b is information for identifying a logical block ID in which cluster corresponding to the logical cluster address 40a is stored. The intra-logical block cluster position 40c indicates a storage position of a cluster corresponding to the logical cluster address 40a in the logical block designated by the logical block ID 40b. Because one logical block includes maximum $2^k$ valid clusters, the intra-logical block cluster position 40c identifies $2^k$ positions using k bits. An FS/IS block ID, which is an index of the FS/IS logical block management table 42 explained later, is registered in the FS/IS block ID 40d. The FS/IS block ID 40d is information for identifying a logical block belonging to the FS 12 or the IS 13. The FS/IS block ID 40d in the FS/IS management table 40 is registered for link to the FS/IS logical block management table 42 explained later. The next pointer 40e indicates a pointer to the next entry in the same list linked for each logical track address.

MS Logical Block Management Table 35 (Reverse Lookup)

The MS logical block management table 35 is explained with reference to FIG. 14. The MS logical block management table 35 is a table for unitarily managing information concerning a logical block used in the MS 11 (e.g., which track is stored and whether a track position is additionally recordable). In the MS logical block management table 35, information concerning logical blocks belonging to the FS 12 (including the FSIB 12) and the IS 13 is also registered. The MS logical block management table 35 is formed in an array format having a logical block ID 35a as an index. The number of entries can be 32 K entries at the maximum in the case of the 128 GB NAND memory 10. Each of the entries includes a track management pointer 35b for $2^i$ tracks, the number of valid tracks 35c, a writable top track 35d, and a valid flag 35e. The MS logical block management table 35 functions as a reverse lookup table because required information such as a logical track address stored in the logical block is obtained from the logical block ID 35a corresponding to a storage device position.

The track management pointer 35b stores a logical track address corresponding to each of $2^i$ track positions in the logical block designated by the logical block ID 35a. It is possible to search through the track management table 30 having the logical track address as an index using the logical track address. The number of valid tracks 35c indicates the number of valid tracks (maximum $2^i$) among tracks stored in the logical block designated by the logical block ID 35a. The writable top track position 35d indicates a top position (0 to $2^{i-1}$, $2^i$ when additional recording is finished) additionally recordable when the logical block designated by the logical block ID 35a is a block being additionally recorded. The valid flag 35e is "1" when the logical block entry is managed as the MS 11 (including the MSIB 11a). Here, "additional recording" means that writing cluster or track, in appending manner, to empty logical pages in a logical block.

FS/IS Logical Block Management Table 42 (Reverse Lookup)

Figure 15:
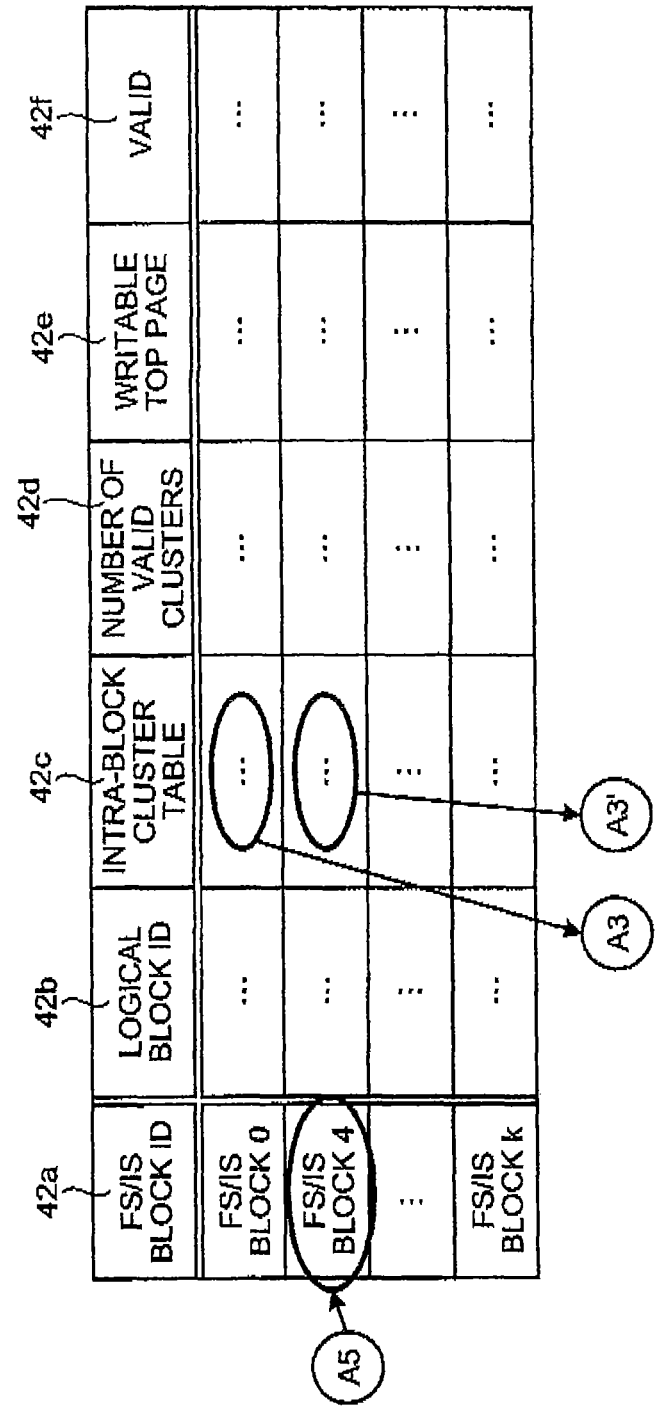
FIG. 15 is a diagram of an example of an FS/IS logical block management table.

The FS/IS logical block management table 42 is explained with reference to FIG. 15. The FS/IS logical block management table 42 is formed in an array format having an FS/IS block ID 42a as an index. The FS/IS logical block management table 42 is a table for managing information concerning a logical block used as the FS 12 or the IS 13 (correspondence to a logical block ID, an index to the intra-FS/IS cluster management table 44, whether the logical block is additionally recordable, etc.). The FS/IS logical block management table 42 is accessed by mainly using the FS/IS block ID 40d in the FS/IS management table 40. Each entry includes a logical block ID 42b, an intra-block cluster table 42c, the number of valid clusters 42d, a writable top page 42e, and a valid flag 42f. The MS logical block management table 35 functions as a reverse lookup table because required information such as cluster stored in the logical block is obtained from the FS/IS block ID 42 corresponding to a storage device position.

Logical block IDs corresponding to logical blocks belonging to the FS 12 (including the FSIB 12) and the IS 13 among logical blocks registered in the MS logical block management table 35 are registered in the logical block ID 42b. An index to the intra-FS/IS cluster management table 44 explained later indicating a logical cluster designated by which logical cluster address is registered in each cluster position in a logical block is registered in the intra-block cluster table 42c. The number of valid clusters 42d indicates the number of (maximum $2^k$) valid clusters among clusters stored in the logical block designated by the FS/IS block ID 42a. The writable top page position 42e indicates a top page position (0 to $2^{j-1}$, $2^j$ when additional recording is finished) additionally recordable when the logical block designated by the FS/IS block ID 42a is a block being additionally recorded. The valid flag 42f is "1" when the logical block entry is managed as the FS 12 (including the FSIB 12) or the IS 13.

Intra-FS/IS Cluster Management Table 44 (Reverse Lookup)

Figure 16:
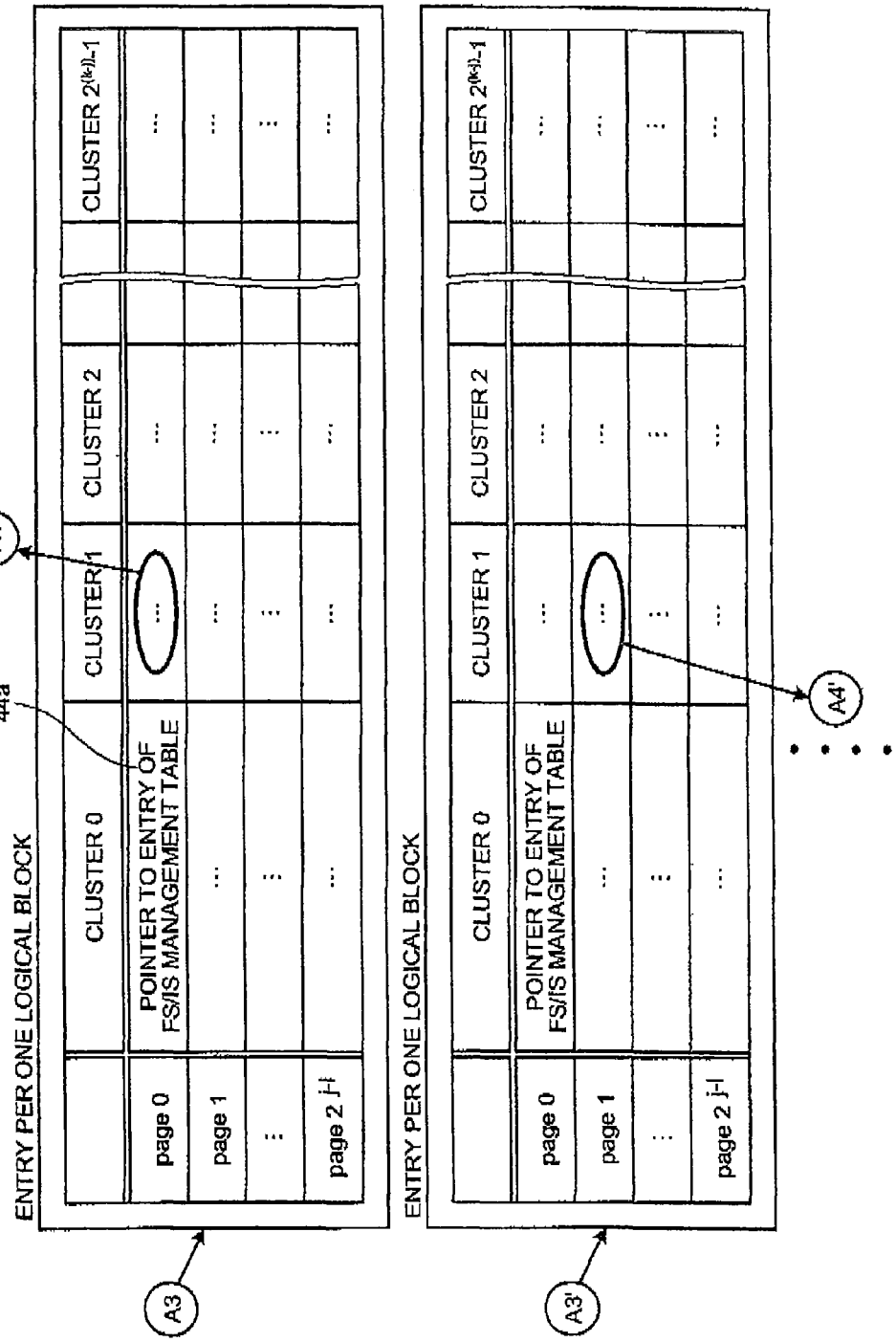
FIG. 16 is a diagram of an example of an intra-FS/IS cluster management table.

The intra-FS/IS cluster management table 44 is explained with reference to FIG. 16. The intra-FS/IS cluster management table 44 is a table indicating which cluster is recorded in each cluster position in a logical block used as the FS 12 or the IS 13. The intra-FS/IS cluster management table 44 has $2^j$ pages×$2^{(k-j)}$ clusters=$2^k$ entries per one logical block. Information corresponding to 0th to $2^k$–1th cluster positions among cluster positions in the logical block is arranged in continuous areas. Tables including the $2^k$ pieces of information are stored by the number equivalent to the number of logical blocks (P) belonging to the FS 12 and the IS 13. The intra-block cluster table 42c of the FS/IS logical block management table 42 is positional information (a pointer) for the P tables. A position of each entry 44a arranged in the continuous areas indicates a cluster position in one logical block. As content of the entry 44a, a pointer to a list including a logical cluster address managed by the FS/IS management table 40 is registered such that it is possible to identify which cluster is stored in the cluster position. In other words, the entry 44a does not indicate the top of a linked list. A pointer to one list including the logical cluster address in the linked list is registered in the entry 44a.

Logical-to-Physical Translation Table 50 (Forward Lookup)

The logical-to-physical translation table 50 is explained with reference to FIG. 17. The logical-to-physical translation table 50 is formed in an array format having a logical block ID 50a as an index. The number of entries can be maximum 32 K entries in the case of the 128 GB NAND memory 10. The logical-to-physical translation table 50 is a table for managing information concerning conversion between a logical block ID and a physical block ID and the life. Each of the entries includes a physical block address 50b, the number of times of erasing 50c, and the number of times of readout 50d. The logical-to-physical translation table 50 functions as a forward lookup table because required information such as a physical block ID (a physical block address) is obtained from a logical block ID.

The physical block address 50b indicates eight physical block IDs (physical block addresses) belonging to one logical block ID 50a. The number of times of erasing 50c indicates the number of times of erasing of the logical block ID. A bad block (BB) is managed in physical block (512 KB) units. However, the number of times of erasing is managed in one logical block (4 MB) units in the 32-bit double speed mode. The number of times of readout 50d indicates the number of times of readout of the logical block ID. The number of times of erasing 50c can be used in, for example, wear leveling processing for leveling the number of times of rewriting of a NAND-type flash memory. The number of times of readout 50d can be used in refresh processing for rewriting data stored in a physical block having deteriorated retention properties.

An example of the wear leveling processing is described in the International Application No. PCT/JP2008/066508 and No. PCT/JP2008/066507. An example of the refresh processing is described in the International Application No. PCT/JP2008/067597, the entire contents of which are incorporated herein by reference.

The management tables shown in FIG. 8 are collated by management object as explained below.

RC management: The RC cluster management table 23

WC management: The WC cluster management table 25 and the WC track management table 24

MS management: The track management table 30 and the MS logical block management table 35

FS/IS management: The track management table 30, the FS/IS management table 40, the MS logical block management table 35, the FS/IS logical block management table 42, and the intra-FS/IS cluster management table 44

The structure of an MS area including the MS 11, the MSIB 11a, and the TFS 11b is managed in an MS structure management table (not shown). Specifically, logical blocks and the like allocated to the MS 11, the MSIB 11a, and the TFS 11b are managed. The structure of an FS/IS area including the FS 12, the FSIB 12a, and the IS 13 is managed in an FS/IS structure management table (not shown). Specifically, logical blocks and the like allocated to the FS 12, the FSIB 12a, and the IS 13 are managed.

Read Processing

Figure 18:
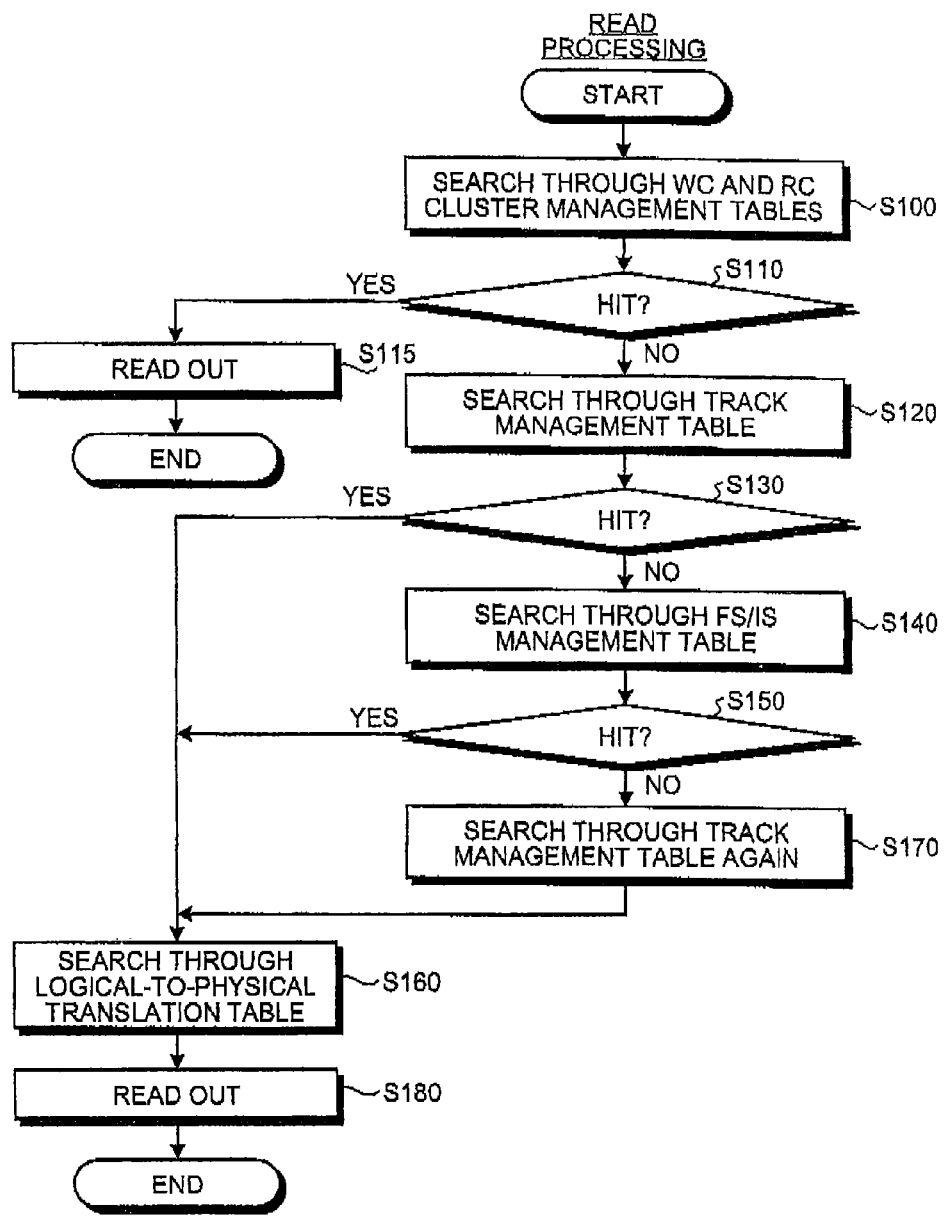
FIG. 18 is a flowchart of an operation example of read processing.

Read processing is explained with reference to a flowchart shown in FIG. 18. When a Read command, LBA as a readout address, and a readout size are input from the ATA-command processing unit 121, the data managing unit 120 searches through the RC cluster management table 23 shown in FIG. 9 and the WC cluster management table 25 shown in FIG. 10 (step S100). Specifically, the data managing unit 120 selects lines corresponding to LSB (k–i) bits (see FIG. 7) of a logical cluster address of the LBA from the RC cluster management table 23 and the WC cluster management table 25 and compares logical track addresses 23b and 25c entered in each way of the selected lines with a logical track address of the LBA (step S110). When a way such that a logical track address entered in itself coincides with a logical track address of LBA is present, the data managing unit 120 regards this as cache hit. The data managing unit 120 reads out data of the WC 21 or the RC 22 corresponding to the hit line and way of the RC cluster management table 23 or the WC cluster management table 25 and sends the data to the ATA-command processing unit 121 (step S115).

When there is no hit in the RC 22 or the WC 21 (step S110), the data managing unit 120 searches in which part of the NAND memory 10 a cluster as a search object is stored. First, the data managing unit 120 searches through the track management table 30 shown in FIG. 12 (step S120). The track management table 30 is indexed by the logical track address 30a. Therefore, the data managing unit 120 checks only entries of the logical track address 30a coinciding with the logical track address designated by the LBA.

The data managing unit 120 selects a corresponding bit from the cluster bitmap 30b based on a logical cluster address of the LBA desired to be checked. When the corresponding bit indicates "0", this means that latest data of the cluster is surely present the MS (step S130). In this case, the data managing unit 120 obtains logical block ID and a track position in which the track is present from the logical block ID 30c and the intra-logical block track position 30d in the same entry of the logical track address 30a. The data managing unit 120 calculates an offset from the track position using LSB (k–i) bits of the logical cluster address of the LBA. Consequently, the data managing unit 120 can calculate position where cluster corresponding to the logical cluster address in the NAND memory 10 is stored. Specifically, the logical-NAND-layer managing unit 120b gives the logical block ID 30c and the intra-logical block position 30d acquired from the track management table 30 as explained above and the LSB (k–i) bits of the logical cluster address of the LBA to the physical-NAND-layer managing unit 120c.

The physical-NAND-layer managing unit 120c acquires a physical block address (a physical block ID) corresponding to the logical block ID 30c from the logical-to-physical translation table 50 shown in FIG. 17 having the logical block ID as an index (step S160). The data managing unit 120 calculates a track position (a track top position) in the acquired physical block ID from the intra-logical block track position 30d and further calculates, from the LSB (k–i) bits of the logical cluster address of the LBA, an offset from the calculated track top position in the physical block ID. Consequently, the data managing unit 120 can acquire cluster in the physical block. The data managing unit 120 sends the cluster acquired from the MS 11 of the NAND memory 10 to the ATA-command processing unit 121 via the RC 22 (step S180).

On the other hand, when the corresponding bit indicates "1" in the search through the cluster bitmap 30b based on the logical cluster address of the LBA, it is likely that the cluster is stored in the FS 12 or the IS 13 (step S130). In this case, the data managing unit 120 extracts an entry of the cluster table pointer 30e among relevant entries of the logical track address 30a in the track management table 30 and sequentially searches through linked lists corresponding to a relevant logical track address of the FS/IS management table 40 using this pointer (step S140). Specifically, the data managing unit 120 searches for an entry of the logical cluster address 40a coinciding with the logical cluster address of the LBA in the linked list of the relevant logical track address. When the coinciding entry of the logical cluster address 40a is present (step S150), the data managing unit 120 acquires the logical block ID 40b and the intra-logical block cluster position 40c in the coinciding list. In the same manner as explained above, the data managing unit 120 acquires the cluster in the physical block using the logical-to-physical translation table 50 (steps S160 and S180). Specifically, the data managing unit 120 acquires physical block addresses (physical block IDs) corresponding to the acquired logical block ID from the logical-to-physical translation table 50 (step S160) and calculates a cluster position of the acquired physical block ID from an intra-logical block cluster position acquired from an entry of the intra-logical block cluster position 40c. Consequently, the data managing unit 120 can acquire the cluster in the physical block. The data managing unit 120 sends the cluster acquired from the FS 12 or the IS 13 of the NAND memory 10 to the ATA-command processing unit 121 via the RC 22 (step S180).

When the cluster as the search object is not present in the search through the FS/IS management table 40 (step S150), the data managing unit 120 searches through the entries of the track management table 30 again and decides a position on the MS 11 (step S170).

Write Processing

Figure 19:
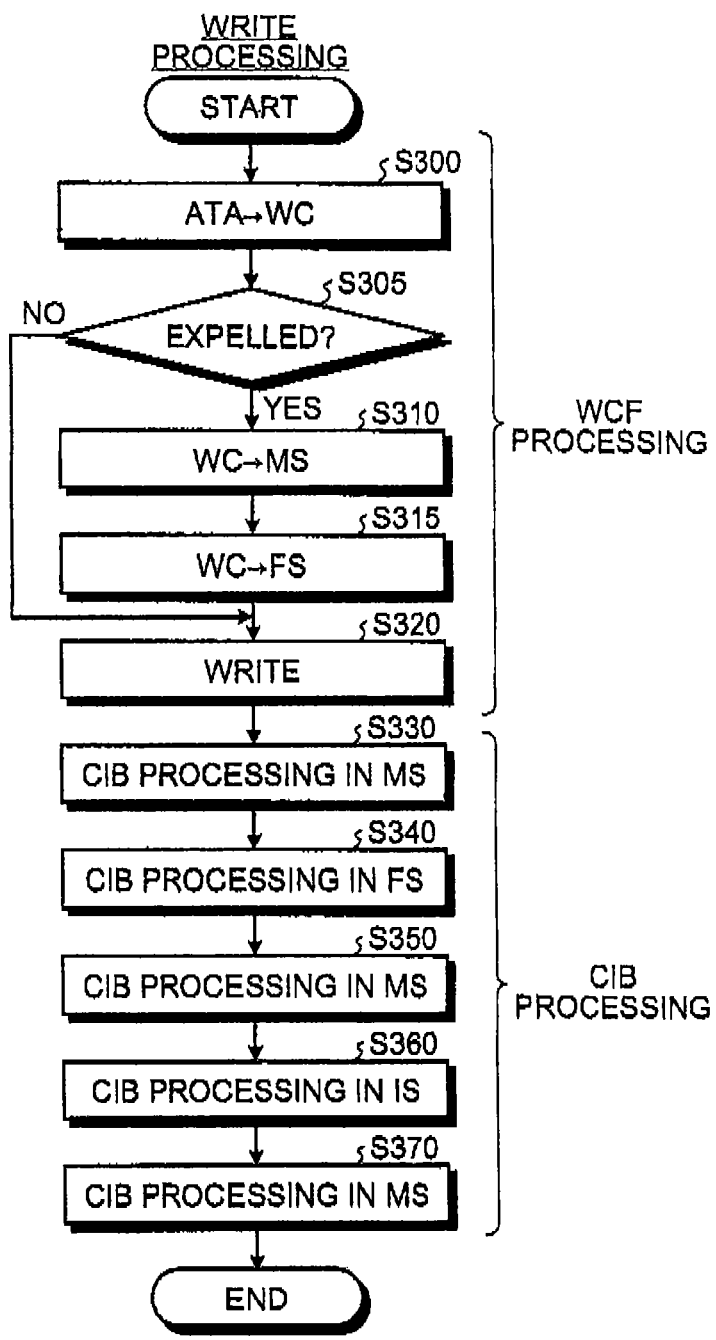
FIG. 19 is a flowchart of an operation example of write processing.
Figure 21:
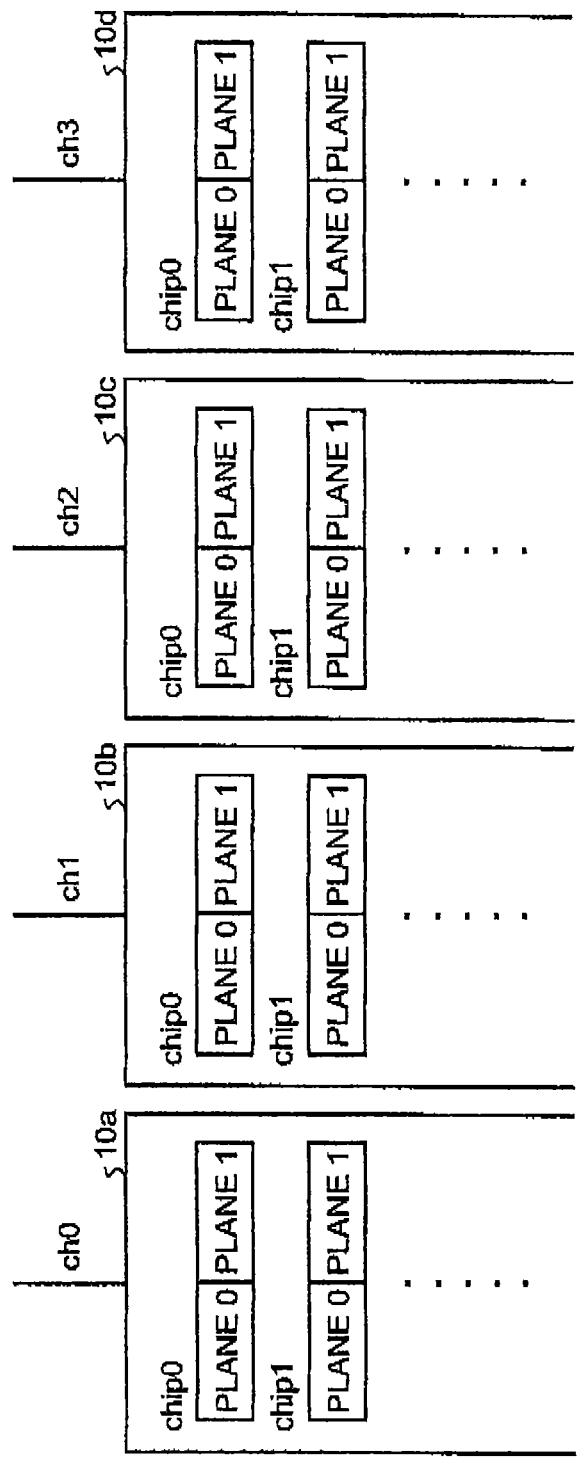
FIG. 21 is a diagram of a diagram of a relation among

Write processing is explained with reference to a flowchart shown in FIG. 19. Data written by a Write command is always once stored on the WC 21. Thereafter, the data is written in the NAND memory 10 according to conditions. In the write processing, it is likely that flush processing and compaction processing are performed. In this embodiment, the write processing is roughly divided into two stages of write cache flash processing (hereinafter, WCF processing) and clean input buffer processing (hereinafter, CIB processing). Steps S300 to S320 indicate processing from a Write request from the ATA-command processing unit 121 to the WCF processing. Step S330 to the last step indicate the CIB processing.

The WCF processing is processing for copying data in the WC 21 to the NAND memory 10 (the FSIB 12a of the FS 12 or the MSIB 11a of the MS 11). A Write request or a Cache Flush request alone from the ATA-command processing unit 121 can be completed only by this processing. This makes it possible to limit a delay in the started processing of the Write request of the ATA-command processing unit 121 to, at the maximum, time for writing in the NAND memory 10 equivalent to a capacity of the WC 21.

The CIB processing includes processing for moving the data in the FSIB 12a written by the WCF processing to the FS 12 and processing for moving the data in the MSIB 11a written by the WCF processing to the MS 11. When the CIB processing is started, it is likely that data movement among the components (the FS 12, the IS 13, the MS 11, etc.) in the NAND memory and compaction processing are performed in a chain-reacting manner. Time required for the overall processing substantially changes according to a state.

WCF Processing

First, details of the WCF processing are explained. When a Write command, LBA as a writing address, and a writing size is input from the ATA-command processing unit 121, the DRAM-layer managing unit 120a searches through the WC cluster management table 25 shown in FIG. 10 (steps S300 and S305). A state of the WC 21 is defined by the state flag 25a (e.g., 3 bits) of the WC cluster management table 25 shown in FIG. 10. Most typically, a state of the state flag 25a transitions in the order of invalid (usable)→a wait for writing from an ATA→valid (unusable)→a wait for flush to an NAND→invalid (usable). First, a line at a writing destination is determined from logical cluster address LSB (k−i) bits of the LBA and n ways of the determined line are searched. When the logical track address 25c same as that of the input LBA is stored in the n ways of the determined lines (step S305), the DRAM-layer managing unit 120a secures this entry as an entry for writing cluster because the entry is to be overwritten (valid (unusable)→a wait for writing from an ATA).

The DRAM-layer managing unit 120a notifies the ATA-command processing unit 121 of a DRAM address corresponding to the entry. When writing by the ATA-command processing unit 121 is finished, the data managing unit 120 changes the state flag 25a of the entry to valid (unusable) and registers required data in spaces of the sector position bitmap 25b and the logical track address 25c. The data managing unit 120 updates the WC track management table 24. Specifically, when an LBA address same as the logical track address 24a already registered in the lists of the WC track management table 24 is input, the data managing unit 120 updates the number of WC clusters 24b and the way-line bitmap 24c of a relevant list and changes the next pointer 24d such that the list becomes a latest list. When an LBA address different from the logical track address 24a registered in the lists of the WC track management table 24 is input, the data managing unit 120 creates a new list having the entries of the logical track address 24a, the number of WC clusters 24b, the way-line bitmap 24c, and the next pointer 24d and registers the list as a latest list. The data managing unit 120 performs the table update explained above to complete the write processing (step S320).

On the other hand, when the logical track address 25c same as that of the input LBA is not stored in the n ways of the determined line, the data managing unit 120 judges whether flush to the NAND memory 10 is necessary (step S305). First, the data managing unit 120 judges whether a writable way in the determined line is a last nth way. The writable way is a way having the state flag 25a of invalid (usable) or a way having the state flag 25a of valid (unusable) and a wait for flush to a NAND. When the state flag 25a is a wait for flush to a NAND, this means that flush is started and an entry is a wait for the finish of the flush. When the writable way is not the last nth way and the writable way is a way having the state flag 25a of invalid (usable), the data managing unit 120 secures this entry as an entry for cluster writing (invalid (usable)→a wait for writing from an ATA). The data managing unit 120 notifies the ATA-command processing unit 121 of a DRAM address corresponding to the entry and causes the ATA-command processing unit 121 to execute writing. In the same manner as explained above, the data managing unit 120 updates the WC cluster management table 25 and the WC track management table 24 (step S320).

When the writable way is not the last nth way and when the writable way is the way having the state flag 25a of valid (unusable) and a wait for flush to a NAND, the data managing unit 120 secures this entry as an entry for writing cluster (valid (unusable) and a wait for flush to a NAND→valid (unusable) and a wait for flush from a NAND and a wait for writing from an ATA). When the flush is finished, the data managing unit 120 changes the state flag 25a to a wait for writing from an ATA, notifies the ATA-command processing unit 121 of a DRAM address corresponding to the entry, and causes the ATA-command processing unit 121 to execute writing. In the same manner as explained above, the data managing unit 120 updates the WC cluster management table 25 and the WC track management table 24 (step S320).

The processing explained above is performed when flush processing does not have to be triggered when a writing request from the ATA-command processing unit 121 is input. On the other hand, processing explained below is performed when flush processing is triggered after a writing request is input. At step S305, when the writable way in the determined line is the last nth way, the data managing unit 120 selects track to be flushed, i.e., an entry in the WC 21 based on the condition explained in (i) of the method of determining data to be flushed from the WC 21 to the NAND memory 10, i.e., (i) when a writable way determined by a tag is a last (in this embodiment, nth) free way, i.e., when the last free way is to be used, track updated earliest based on an LRU among track registered in the line is decided to be flushed.

When that track to be flushed is determined according to the policy explained above, as explained above, if all cluster in the WC 21 included in an identical logical track address are to be flushed and an amount of cluster to be flushed exceeds 50% of a track size, i.e., if the number of valid cluster in the WC is equal to or larger than $2^{(k-i-1)}$ in the track decided to be flushed, the DRAM-layer managing unit 120a performs flush to the MSIB 11a (step S310). If the amount of cluster does not exceeds 50% of the track size, i.e., the number of valid cluster in the WC is smaller than $2^{(k-i-1)}$ in the track decided to be flushed, the DRAM-layer managing unit 120a performs flush to the FSIB 12a (step S315). Details of the flush from the WC 21 to the MSIB 11a and the flush from the WC 21 to the FSIB 12a are explained later. The state flag 25a of the selected flush entry is transitioned from Valid (unusable) to a wait for flush to the NAND memory 10.

This judgment on a flush destination is executed by using the WC track management table 24. An entry of the number of WC clusters 24 indicating the number of valid clusters is registered in the WC track management table 24 for each logical track address. The data managing unit 120 determines which of the FSIB 12a and the MSIB 11a should be set as a destination of flush from the WC 21 referring to the entry of the number of WC clusters 24b. All clusters belonging to the logical track address are registered in a bitmap format in the way-line bitmap 24c. Therefore, in performing flush, the data managing unit 120 can easily learn, referring to the way-line bitmap 24c, a storage position in the WC 21 of each of the cluster that should be flushed.

During the write processing or after the write processing, the data managing unit 120 also execute the flush processing to the NAND memory 10 in the same manner when the following condition is satisfied:

(ii) the number of tracks registered in the WC 21 exceeds a predetermined number.

WC→MSIB (Copy)

When flush from the WC 21 to the MSIB 11a is performed according to the judgment based on the number of valid clusters (the number of valid clusters is equal to or larger than $2^{(k-i-1)}$), the data managing unit 120 executes a procedure explained below as explained above (step S310).

1. Referring to the WC cluster management table 25 and referring to the sector position bitmaps 25b in tags corresponding to cluster to be flushed, when all the sector position bitmaps 25b are not "1", the data managing unit 120 performs intra-track sector padding (track padding) explained later for merging with sector not present in the WC 21 by reading out the missing sector included in the identical logical track address from the MS 11.

2. When the number of tracks decided to be flushed is less than $2^i$, the data managing unit 120 adds tracks decided to be flushed having $2^{(k-i-1)}$ or more valid clusters until the number of tracks decided to be flushed reaches $2^i$ from the oldest one in the WC 21.

3. When there are $2^i$ or more tracks to be copied, the data managing unit 120 performs writing in the MSIB 11a in logical block units with each $2^i$ tracks as a set.

4. The data managing unit 120 writes the tracks that cannot form a set of $2^i$ tracks in the MSIB 11a in track units.

5. The data managing unit 120 invalidates clusters and tracks belonging to the copied tracks among those already present on the FS, the IS, and the MS after the Copy is finished.

Update processing for the respective management tables involved in the Copy processing from the WC 21 to the MSIB 11a is explained. The data managing unit 120 sets the state flag 25a in entries corresponding to all clusters in the WC 21 belonging to a flushed track in the WC cluster management table 25 Invalid. Thereafter, writing in these entries is possible. Concerning a list corresponding to the flushed track in the WC track management table 24, the data managing unit 120 changes or deletes, for example, the next pointer 24d of an immediately preceding list and invalidates the list.

On the other hand, when track flush from the WC 21 to the MSIB 11a is performed, the data managing unit 120 updates the track management table 30 and the MS logical block management table 35 according to the track flush. First, the data managing unit 120 searches for the logical track address 30a as an index of the track management table 30 to judge whether the logical track address 30a corresponding to the flushed track is already registered. When the logical track address 30a is already registered, the data managing unit 120 updates fields of the cluster bitmap 30b (because the track is flushed to the MS 11 side, all relevant bits are set to "0") of the index and the logical block ID 30c+ the intra-logical block track position 30d. When the logical track address 30a corresponding to the flushed track is not registered, the data managing unit 120 registers the cluster bitmap 30b and the logical block ID 30c+ the intra-logical block track position 30d in an entry of the relevant logical track address 30a. The data managing unit 120 updates, according to the change of the track management table 30, entries of the logical block ID 35a, the track management pointer 35b, the number of valid tracks 35c, the writable top track 35d, and the like in the MS logical block management table 35 when necessary.

When track writing is performed from other areas (the FS 12 and the IS 13) to or the like to the MS 11 or when intra-MS track writing by compaction processing in the MS 11 is performed, valid clusters in the WC 21 included in the logical track address as a writing object may be simultaneously written in the MS 11. Such passive merge may be present as writing from the WC 21 to the MS 11. When such passive merge is performed, the clusters are deleted from the WC 21 (invalidated).

WC→FSIB (Copy)

When flush from the WC 21 to the FSIB 12a is performed according to the judgment based on the number of valid clusters (the number of valid clusters is equal to or larger than $2^{(k-i-1)}$), the data managing unit 120 executes a procedure explained below.

1. Referring to the sector position bitmaps 25*b* in tags corresponding to clusters to be flushed, when all the sector position bitmaps 25*b* are not "1", the data managing unit 120 performs intra-cluster sector padding (cluster padding) for merging with sector not present in the WC 21 by reading out the missing sector included in the identical logical cluster address from the FS 12, the IS 13, and the MS 11.

2. The data managing unit 120 extracts clusters from a track having only less than $2^{(k-i-1)}$ valid clusters tracing tracks in the WC 21 in order from oldest one and, when the number of valid clusters reaches $2^k$, writes all the clusters in the FSIB 12*a* in logical block units.

3. When $2^k$ valid clusters are not found, the data managing unit 120 writes all track with the number of valid clusters less than $2^{(k-i-1)}$ in the FSIB 12*a* by the number equivalent to the number of logical pages.

4. The data managing unit 120 invalidates clusters with same logical cluster address as the clusters copied among those already present on the FS 12 and the IS 13 after the Copy is finished.

Update processing for the respective management tables involved in such Copy processing from the WC 21 to the FSIB 12*a* is explained. The data managing unit 120 sets the state flag 25*a* in entries corresponding to all clusters in the WC 21 belonging to a flushed track in the WC cluster management table 25 Invalid. Thereafter, writing in these entries is possible. Concerning a list corresponding to the flushed track in the WC track management table 24, the data managing unit 120 changes or deletes, for example, the next pointer 24*d* of an immediately preceding list and invalidates the list.

On the other hand, when cluster flush from the WC 21 to the FSIB 12*a* is performed, the data managing unit 120 updates the cluster table pointer 30*e*, the number of FS clusters 31*f*, and the like of the track management table 30 according to the cluster flush. The data managing unit 120 also updates the logical block ID 40*b*, the intra-logical block cluster position 40*c*, and the like of the FS/IS management table 40. Concerning clusters not present in the FS 12 originally, the data managing unit 120 adds a list to the linked list of the FS/IS management table 40. According to the update, the data managing unit 120 updates relevant sections of the MS logical block management table 35, the FS/IS logical block management table 42, and the intra-FS/IS cluster management table 44.

CIB Processing

When the WCF processing explained above is finished, the logical-NAND-layer managing unit 120*b* executes CIB processing including processing for moving the data in the FSIB 12*a* written by the WCF processing to the FS 12 and processing for moving the data in the MSIB 11*a* written by the WCF processing to the MS 11. When the CIB processing is started, as explained above, it is likely that data movement among the blocks and compaction processing are performed in a chain reacting manner. Time required for the overall processing substantially changes according to a state. In the CIB processing, basically, first, the CIB processing in the MS 11 is performed (step S330), subsequently, the CIB processing in the FS 12 is performed (step S340), the CIB processing in the MS 11 is performed again (step S350), the CIB processing in the IS 13 is performed (step S360), and, finally, the CIB processing in the MS 11 is performed again (step S370). In flush processing from the FS 12 to the MSIB 11*a*, flush processing from the FS 12 to the IS 13, or flush processing from the IS 13 to the MSIB 11*a*, when a loop occurs in a procedure, the processing may not be performed in order. The CIB processing in the MS 11, the CIB processing in the FS 12, and the CIB processing in the IS 13 are separately explained.

CIB Processing in the MS 11

First, the CIB processing in the MS 11 is explained (step S330). When movement of track from the WC 21, the FS 12, and the IS 13 to the MS 11 is performed, the track is written in the MSIB 11*a*. After the completion of writing in the MSIB 11*a*, as explained above, the track management table 30 is updated and the logical block ID 30*c*, the intra-block track position 30*d*, and the like in which tracks are arranged are changed (Move). When new track is written in the MSIB 11*a*, track present in the MS 11 or the TFS 11*b* from the beginning is invalidated. This invalidation processing is realized by invalidating a track from an entry of a logical block in which old track information is stored in the MS logical block management table 35. Specifically, a pointer of a relevant track in a field of the track management pointer 35*b* in the entry of the MS logical block management table 35 is deleted and the number of valid tracks is decremented by one. When all tracks in one logical block are invalidated by this track invalidation, the valid flag 35*e* is invalidated. Logical blocks of the MS 11 including invalid tracks are generated by such invalidation or the like. When this is repeated, efficiency of use of logical blocks may fall to cause insufficiency in usable logical blocks.

When such a situation occurs and the number of logical blocks allocated to the MS 11 exceeds the upper limit of the number of logical blocks allowed for the MS 11, the data managing unit 120 performs compaction processing to create a free block FB. The free block FB is returned to the physical-NAND-layer managing unit 120*c*. The logical-NAND-layer managing unit 120*b* reduces the number of logical blocks allocated to the MS 11 and, then, acquires a writable free block FB from the physical-NAND-layer managing unit 120*c* anew. The compaction processing is processing for collecting valid clusters of a logical block as a compaction object in a new logical block or copying valid tracks in the logical block as the compaction object to other logical blocks to create a free block FB returned to the physical-NAND-layer managing unit 120*c* and improve efficiency of use of logical blocks. In performing compaction, when valid clusters on the WC 21, the FS 12, and the IS 13 are present, the data managing unit 120 executes passive merge for merging all the valid clusters included in a logical track address as a compaction object. Logical blocks registered in the TFS 11*b* are not included in the compaction object.

An example of Move from the MSIB 11*a* to the MS 11 or to the TFS 11*b* and compaction processing with presence of a full logical block in the MSIB 11*a* set as a condition is specifically explained. The "full" logical block means the logical block in which all logical pages has been written and additional recording is impossible.

1. Referring to the valid flag 35*e* of the MS logical block management table 35, when an invalidated logical block is present in the MS 11, the data managing unit 120 sets the logical block as a free block FB.

2. The data managing unit 120 moves a full logical block in the MSIB 11*a* to the MS 11. Specifically, the data managing unit 120 updates the MS structure management table (not shown) explained above and transfers the logical block from management under the MSIB 11*a* to management under the MS 11.

3. The data managing unit 120 judges whether the number of logical blocks allocated to the MS 11 exceeds the upper limit of the number of logical blocks allowed for the MS 11.

When the number of logical blocks exceeds the upper limit, the data managing unit 120 executes MS compaction explained below.

4. Referring to a field and the like of the number of valid tracks 35c of the MS logical block management table 35, the data managing unit 120 sorts logical blocks having invalidated tracks among logical blocks not included in the TFS 11b with the number of valid tracks.

5. The data managing unit 120 collects tracks from logical blocks with small numbers of valid tracks and carries out compaction. In carrying out compaction, first, the tracks are copied for each of the logical blocks ($2^i$ tracks are copied at a time) to carry out compaction. When a track as a compaction object has valid clusters in the WC 21, the FS 12, and the IS 13, the data managing unit 120 also merges the valid clusters.

6. The data managing unit 120 sets the logical block at a compaction source as a free block FB.

7. When the compaction is performed and one logical block includes the valid $2^i$ tracks, the data managing unit 120 moves the logical block to the top of the TFS 11b.

8. When the free block FB can be created by copying the valid tracks in the logical block to another logical block, the data managing unit 120 additionally records the valid tracks in the number smaller than $2^i$ in the MSIB 11a in track units.

9. The data managing unit 120 sets the logical block at the compaction source as the free block FB.

10. When the number of logical blocks allocated to the MS 11 falls below the upper limit of the number of logical blocks allowed for the MS 11, the data managing unit 120 finishes the MS compaction processing.

CIB Processing in the FS 12

The CIB processing in the FS 12 is explained (step S340). When full logical blocks in which all logical pages are written are created in the FSIB 12a by cluster writing processing from the WC 21 to the FSIB 12a, the logical blocks in the FSIB 12a are moved from the FSIB 12a to the FS 12. According to the movement, an old logical block is flushed from the FS 12 of the FIFO structure configured by a plurality of logical blocks.

Flush from the FSIB 12a to the FS 12 and flush from the FS 12 to the MS 11 and/or the IS 13 are specifically realized as explained below.

1. Referring to the valid flag 35e and the like of the FS/IS logical block management table 42, when an invalidated logical block is present in the FS 12, the data managing unit 120 sets the logical block as a free block FB.

2. The data managing unit 120 flushes a full logical block in the FSIB 12a to the FS 12. Specifically, the data managing unit 120 updates the FS/IS structure management table (not shown) and transfers the logical block from management under the FSIB 12a to management under the FS 12.

3. The data managing unit 120 judges whether the number of logical blocks allocated to the FS 12 exceeds the upper limit of the number of logical blocks allowed for the FS 12. When the number of logical blocks exceeds the upper limit, the data managing unit 120 executes flush explained below.

4. The data managing unit 120 determines cluster that should be directly copied to the MS 11 without being moving to the IS 13 among clusters in an oldest logical block as an flush object (actually, because a management unit of the MS 11 is a track, the cluster is determined in track units).

(A) The data managing unit 120 scans valid clusters in the oldest logical block as the flush object in order from the top of a logical page.

(B) The data managing unit 120 finds, referring to a field of the number of FS clusters 30f of the track management table 30, how many valid clusters a track to which the cluster belongs has in the FS 12.

(C) When the number of valid clusters in the track is equal to or larger than a predetermined threshold (e.g., 50% of $2^{k-1}$), the data managing unit 120 sets the track as a candidate of flush to the MS 11.

5. The data managing unit 120 writes the track that should be flushed to the MS 11 in the MSIB 11a.

6. When valid clusters to be flushed in the track units are left in the oldest logical block, the data managing unit 120 further executes flush to the MSIB 11a.

7. When valid clusters are present in the logical block as the flush object even after the processing of 2 to 4 above, the data managing unit 120 moves the oldest logical block to the IS 13.

When flush from the FS 12 to the MSIB 11a is performed, immediately after the flush, the data managing unit 120 executes the CIB processing in the MS 11 (step s350).

CIB Processing in the IS 13

The CIB processing in the IS 13 is explained (step S360). The logical block is added to the IS 13 according to the movement from the FS 12 to the IS 13. However, according to the addition of the logical block, the number of logical blocks exceeds an upper limit of the number of logical blocks that can be managed in the IS 13 formed of a plurality of logical blocks. When the number of logical blocks exceeds the upper limit, in the IS 13, the data managing unit 120 performs flush of one to a plurality of logical blocks to the MS 11 and executes IS compaction. Specifically, the data managing unit 120 executes a procedure explained below.

1. The data managing unit 120 sorts tracks included in the IS 13 with the number of valid clusters in the track× a valid cluster coefficient, collects $2^{i+1}$ tracks (for two logical blocks) with a large value of a product, and flushes the tracks to the MSIB 11a.

2. When a total number of valid clusters of $2^{i+1}$ logical blocks with a smallest number of valid clusters is, for example, equal to or larger than $2^k$ (for one logical block), which is a predetermined set value, the data managing unit 120 repeats the step explained above.

3. After performing the flush, the data managing unit 120 collects $2^k$ clusters in order from a logical block with a smallest number of valid clusters and performs compaction in the IS 13.

4. The data managing unit 120 releases a logical block not including a valid cluster among the logical blocks at compaction sources as a free block FB.

When flush from the IS 13 to the MSIB 11a is performed, immediately after the flush, the data managing unit 120 executes the CIB processing in the MS 11 (step S370).

FIG. 20 is a diagram of combinations of inputs and outputs in a flow of data among components and indicates what causes the flow of the data as a trigger. Basically, data is written in the FS 12 according to cluster flush from the WC 21. However, when intra-cluster sector padding (cluster padding) is necessary incidentally to flush from the WC 21 to the FS 12, data from the FS 12, the IS 13, and the MS 11 are merged.

In the WC 21, it is possible to perform management in sector (512 B) units by identifying presence or absence of $2^{(l-k)}$ sectors in a relevant logical cluster address using the sector position bitmap 25b in the tag of the WC cluster management table 25. On the other hand, a management unit of the FS 12 and the IS 13, which are functional components in the NAND memory 10, is a cluster and a management unit of the MS 11 is a track. In this way, a management unit in the NAND memory 10 is larger than the sector.

Therefore, in writing data in the NAND memory 10 from the WC 21, when data with a logical cluster or track address identical with that of the data to be written is present in the NAND memory 10, it is necessary to write the data in the NAND memory 10 after merging a sector in the cluster or track to be written in the NAND memory 10 from the WC 21 with and a sector in the identical logical cluster address present in the NAND memory 10.

This processing is the intra-cluster sector padding processing (the cluster padding) and the intra-track sector padding (the track padding) shown in FIG. 20. Unless these kinds of processing are performed, correct data cannot be read out. Therefore, when data is flushed from the WC 21 to the FSIB 12a or the MSIB 11a, the WC cluster management table 25 is referred to and the sector position bitmaps 25b in tags corresponding to clusters to be flushed is referred to. When all the sector position bitmaps 25b are not "1", the intra-cluster sector padding or the intra-track sector padding for merging with a sector in an identical cluster or an identical track included in the NAND memory 10 is performed. A work area of the DRAM 20 is used for this processing. A plurality of sectors included in a logical cluster address or a logical track address is merged on the work area of the DRAM 20 and data image (cluster image or track image) to be flushed is created. The created data image is written in the MSIB 11a or written in the FSIB 12a from the work area of the DRAM 20.

In the IS 13, basically, data is written according to block flush from the FS 12 (Move) or written according to compaction in the IS 13.

In the MS 11, data can be written from all components, the WC 21, the FS 12, the IS 13, the MS 11. When track is written in the MS 11, padding due to data of the MS 11 itself can be caused because data can only be written in track units (track padding). Further, when the data is flushed from the WC 21, the FS 12, or the IS 13 in track units, in addition to track padding, fragmented data in other components, the WC 21, the FS 12, and the IS 13 are also involved according to passive merge. Moreover, in the MS 11, data is also written according to the MS compaction.

In the passive merge, when track flush from one of three components of the WC 21, the FS 12, or the IS 13 to the MS 11 is performed, valid clusters stored in the other two components included in the logical track address range of the flushed track and valid clusters in the MS 11 are collected and merged in the work area of the DRAM 20 and written in the MSIB 11a from the work area of the DRAM 20 as data for one track.

A main part of this embodiment is explained below. When a secondary storage device of a personal computer is configured by using a flash memory, a block that cannot be used as a storage area (a failure block), an area from which data cannot be read out (a failure area), and the like may occur because, for example, a large number of errors occur. When the number of failure blocks or the number of failure areas exceeds an upper limit value, because a new failure block or a new failure area cannot be registered, both data stored in a cache memory and data requested to be written may not be able to be written in the flash memory. Therefore, when the number of failure blocks or the number of failure areas exceeds a predetermined value, regardless of the fact that there is a free capacity in the flash memory, it is likely that data writing suddenly becomes impossible. In the following explanation, a method for coping with such a problem is mainly explained.

First, the physical NAND layer is explained. As explained above, in the 32-bit double speed mode, four channels (ch0, ch1, ch2, and ch3) are actuated in parallel and erasing, writing, and readout are performed by using a double speed mode of an NAND memory chip. As shown in FIG. 23, each of NAND memory chips in the four parallel operation elements 10a to 10d is divided into, for example, two districts of a plane 0 and a plane 1. The number of division is not limited to two. The plane 0 and the plane 1 include peripheral circuits independent from one another (e.g., a row decoder, a column decoder, a page buffer, and a data cache) and can simultaneously perform erasing, writing, and readout based on a command input from the NAND controller 112. In the double speed mode of the NAND memory chip, high-speed writing is realized by controlling the plane 0 and the plane 1 in parallel.

A physical block size is 512 kB. Therefore, in the 32-bit double speed mode, an erasing unit of the physical block is increased to 512 kB×4×2=4 MB according to the parallel operation of the four channels and the simultaneous access to the two planes. As a result, in the 32-bit double speed mode, eight planes operate in parallel.

The physical-NAND-layer managing unit 120c shown in FIG. 8 includes a bad block management table (a BB management table) 200 besides the logical-to-physical conversion table 50 and performs management of the physical NAND layer of the NAND memory 10 using this management table.

Figure 25:
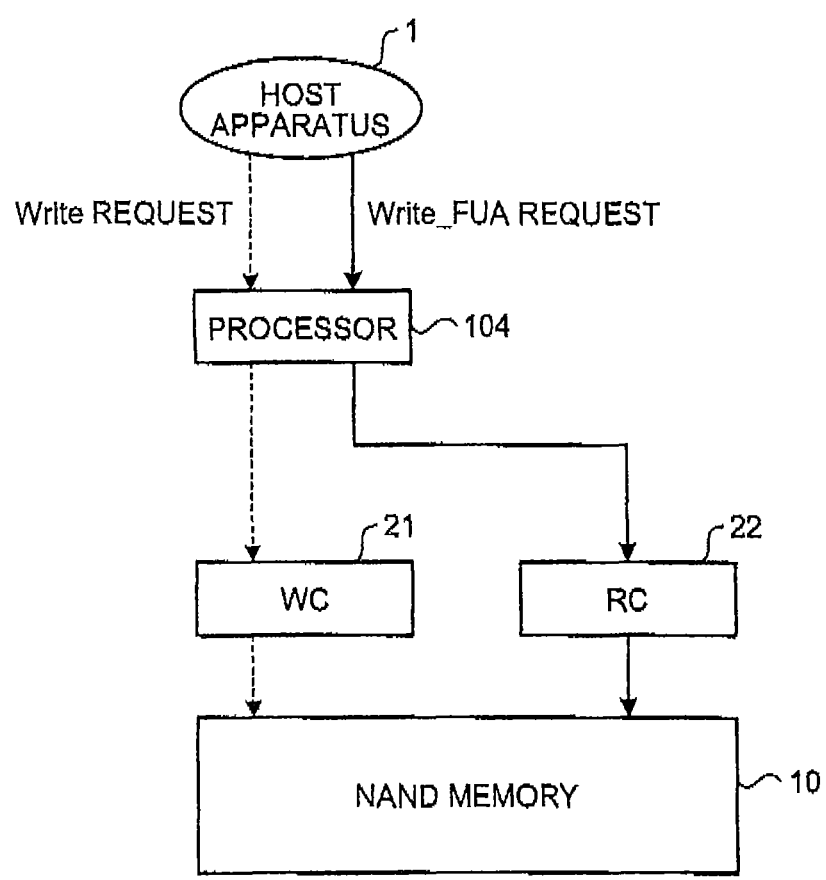
FIG. 25 is a diagram for explaining Write_FUA processing.

The BB management table 200 (a second management table) is a table for managing bad blocks (a second failure area) BB in physical block (512 kB) units. As shown in FIG. 25, the BB management table 200 is formed in a two-dimensional array format having, for example, for every 4 (channels)×2 (planes/channels) intra-channel planes, information concerning physical blocks for (the number of physical blocks/planes)×(the number of NAND memory chips/one parallel operation element). In each entry of the BB management table 200, a physical block ID 200a for each physical block is stored.

In the case of this embodiment, one NAND memory chip has a 2 GB size. Physical block IDs "0" to "2047" are allocated to a plane 0 of a first chip. Physical block IDs "2048" to "4095" are allocated to a plane 1 of the first chip. When the bad block BB generated during use is registered in the BB management table 200, the physical-NAND-layer managing unit 120c adds bad blocks BB immediately behind last valid entries of intra-channel plane IDs (ID#0 to ID#7) corresponding thereto without sorting the bad blocks BB.

In this way, only the physical blocks ID corresponding to the back block BB are sequentially registered in the BB management table 200.

The data managing unit 120 (see FIG. 4) further performs error correction by the first ECC circuit 112 (see FIG. 3) when a cluster read out from the NAND memory 10 (see FIGS. 1 and 5) cannot be corrected by the second ECC circuit 118 (see FIG. 3). The second ECC circuit 118 performs, for example, minor error correction employing a humming code. The first ECC circuit 112 performs, for example, normal error correction employing a BCH code. The first ECC circuit 112 may perform only error correction processing and the second ECC circuit 118 may perform encoding for error correction.

The decoding in the first ECC circuit 112 is interrupted by the processor 104 (see FIG. 3) only when an error cannot be corrected by the error correction processing by the second ECC circuit 118. For example, in readout operation of the NAND memory 10 responding to a Read request from the host apparatus 1, when an error cannot be corrected by the error correction processing by the second ECC circuit 118, data with the error is transferred from the NAND controller 113 (see FIG. 3) to the first ECC circuit 112 according to the control by the processor 104. The data corrected by the first ECC circuit 112 is output to the host apparatus 1 after being written in the RC 22 (see FIG. 5). To monitor reliability of the NAND memory 10, it is desirable to notify the processor 104 of the number of error corrections during error correction by the first ECC circuit 112 and during interrupt control by the processor 104.

Bad Cluster Table

FIG. 23 is a diagram of the structure of a bad cluster table 90. In FIG. 23, the bad cluster table (a first management table) 90 is a table for recording a cluster address (a first failure area) that cannot be read out from the NAND memory 10. In the bad cluster table 90, two fields formed by a cluster address 90a and a sector bitmap 90b are provided. The bad cluster table 90 includes $2^k$ entries in association with the number of clusters of one logical block. The bad cluster table 90 is referred to by the FS/IS management table 40 as a forward lookup table. A storage device position where data corresponding to a logical address of a logical track address can be searched from the logical track address. Therefore, the bad cluster table 90 functions as the forward lookup table.

In the bad cluster table 90, cluster addresses (Addr0 to Addr($2^k$–1) sorted in ascending order or descending order are arranged in the cluster address 90a. A $2^{(l-k)}$-bit bitmap indicating a state (valid: "0"/invalid: "1") of $2^{(l-k)}$ sectors corresponding to the respective cluster addresses is recorded in the sector bitmap 90b. Concerning the bad cluster table 90, "valid" means a state in which valid data corresponding to a relevant sector address is written from the host apparatus 1 anew and latest valid data is present on the WC 21 and the NAND memory 10 different from an area registered as a bad cluster. "Invalid" means a state in which the valid data corresponding to the sector address is not present on the WC 21 and the NAND memory 10 (a bad sector). In this way, only a bad cluster address corresponding to the bad cluster is registered in the cluster address 90a of the back cluster table 90. In the bad cluster table 90, for example, as indicated by Addr0 in FIG. 23, when a sector bitmap is "0000 . . . 1000", this indicates that a fourth sector of the $2^{(1-k)}$ sectors belonging to the cluster address Addr0 is in the invalid state.

In the Read processing, when the data managing unit 120 performs data retrieval in cluster units using the track management table 30 and the FS/IS management table 40, the data managing unit 120 simultaneously perform search through the back cluster table 90. When a readout target cluster is a bad cluster, the data managing unit 120 informs the ATA-command processing unit 121 of an error. However, the data managing unit 120 performs the Read processing as usual until immediately before an error occurs and transfers data to the ATA-command processing unit 121.

Registration Processing Employing the Bad Cluster Table

Figure 24:
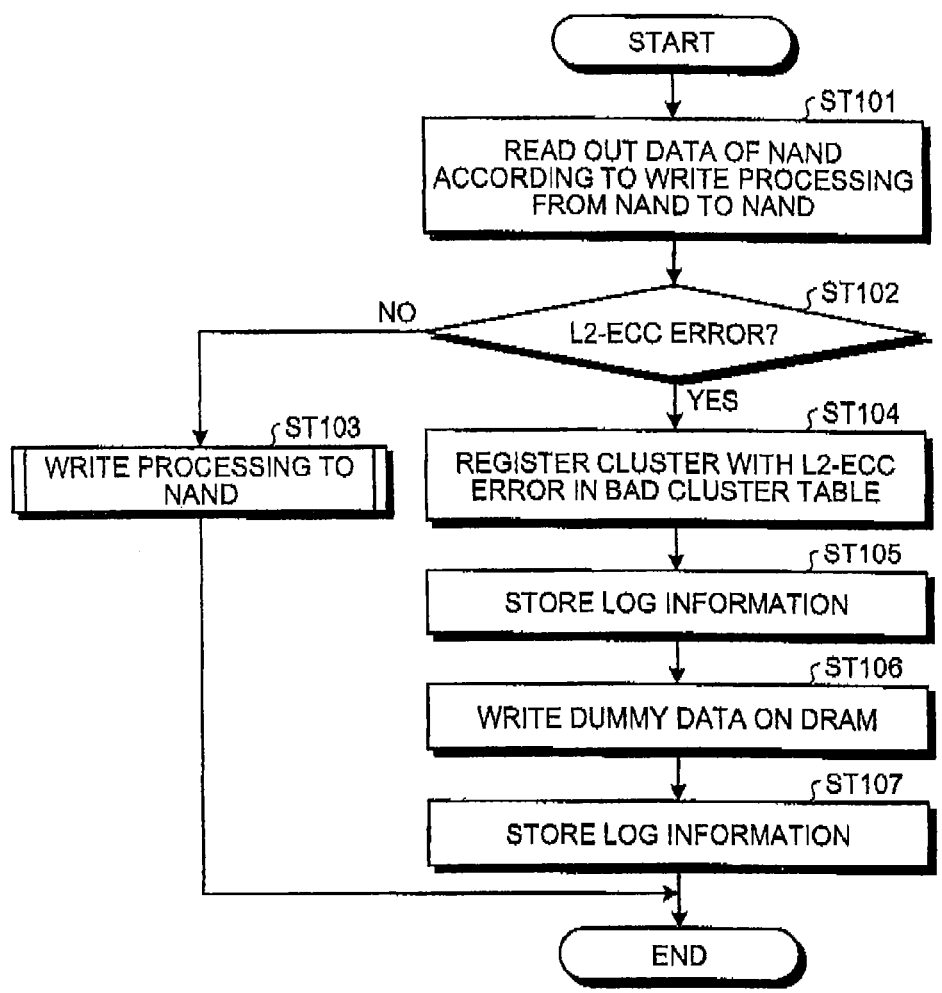
FIG. 24 is a flowchart of processing for registering bad cluster information in the bad cluster table.

FIG. 24 is a flowchart of processing for registering bad cluster information in the bad cluster table 90.

In FIG. 24, according to a request from the data managing unit 120, "processing for reading out data from the NAND memory 10 involved in processing for writing data stored in the NAND memory 10 in the NAND memory 10" is executed (step ST101). Presence or absence of an L2-ECC error is determined (step ST102). The "L2-ECC error" means that an error cannot be corrected by error correction processing employing a second error correction code by the first ECC circuit 112 (see FIG. 3). As explained above, the error correction processing employing the first correction code by the second ECC circuit 118 is performed before the error correction processing employing the second error correction code.

For example, processing explained below corresponds to the "processing for reading out data from the NAND memory 10 involved in processing for writing data stored in the NAND memory 10 in the NAND memory 10" (see FIG. 20).

(1) Cluster padding processing from the FS 12, the IS 13, and the MS 11 to the FS 12
(2) Compaction processing in the MS 11 and the IS 13
(3) Passive merge processing to the MS 11
(4) Track flushing processing to the MS 11

Referring back to FIG. 24, when the L2-ECC error is not detected ("No" at step ST102), write processing to the NAND memory 10 is performed (step ST103). The write processing at step ST103 is performed according to the flow shown in FIG. 19.

On the other hand, when the L2-ECC error is detected ("Yes" at step ST102), an entry of a cluster in which the L2-ECC error occurs is registered in the bad cluster table 90 (step ST104). In sector bitmap 90b, "1" is set in an invalid sector. When a section in a part of the cluster is about to be written from the WC, "0" is set in only the sector. When an entry is already registered in the bad cluster table 90, the sector bit is changed to "1". Concerning the processing at step ST104, log information explained later is acquired and stored in a predetermined storage area (step ST105). Thereafter, among data that need to be read out from the NAND memory 10, writing is executed again for data, a data readout source of which is registered in the bad cluster table 90, assuming that the readout source is dummy data (e.g., all "0") in a dummy data area of the DRAM 20 (step ST106). Thereafter, log information is stored (step ST107) and the processing is finished. Because contents of the writing are different in the processing at step ST104 and the processing at step ST106, storage of a log is necessary.

The log information is a history with respect to data writing and data erasing. Specifically, the log information indicates content (difference information before and after change) concerning a change that occurs in, for example, information (the cluster address 90a and the sector bitmap 90b) registered in the bad cluster table 90 or the BB management table 200. For example, in the NAND memory 10 and the DRAM 20, a backup copy of the bad cluster table 90 and the BB management table 200 are taken at predetermined timing and log information that records update for this backup copy is generated. Thereafter, processing for taking a backup copy at every predetermined time, invalidating log information in the past generated before the backup copy is taken, and generating new log information is repeated. When data is invalidated, the data is restored based on the backup copy and the log information.

Processing for Deleting Bad Cluster Information

Deletion of bad cluster information is performed, for example, when data is written in the NAND memory 10 following flushing of data from the WC 21. When such write processing is performed, a storage area replaced with the dummy data changes to an invalid cluster. Therefore, it is unnecessary to store the invalid cluster as a bad cluster. It is possible to delete the bad cluster information. In the bad cluster table, a value of a relevant sector bit of the cluster changed to the invalid cluster is changed from "1" to "0".

Supplementary Explanation—Processing Employing the Bad Cluster Table

When the L2-ECC error occurs in the readout processing from the NAND memory 10, as explained above, registration processing in the back cluster table 90 for identifying a relevant cluster on the NAND memory 10 as an invalid cluster is performed. When the cluster is already entered in the bad cluster table 90, a bit of a relevant sector in the sector bitmap 90b corresponding to the cluster is changed from "0" (valid) to "1" (invalid).

The bad cluster table 90 is information table managed in the logical-NAND-layer managing unit 120b and the physical-NAND-layer managing unit 120*c* explained with reference to FIG. 8 and is information that needs to be stored until the next startup of the memory system in power-off or the like. Therefore, the bad cluster table 90 is stored in the NAND memory 10 serving as a nonvolatile area. As explained above, a necessary backup copy and log information are stored according to the registration processing for the bad cluster table 90. Because the bad cluster table 90 is one of nonvolatile tables (information stored in the nonvolatile area), accurate information needs to be managed as one of management tables. Therefore, the log information is stored.

In the above explanation, the number of bad clusters is not specifically referred to. In the registration processing in the bad cluster table, a determination threshold may be provided for the number of remaining entries of the bad cluster table 90 to manage the number of bad clusters. For example, when the number of remaining entries of the bad cluster table 90 is equal to or smaller than a predetermined value, first warning information is notified. When the number of remaining entries decreases to 0, second warning information is notified.

In the above explanation, when latest valid data is written anew (updated) from the host apparatus 1, a bit map of a relevant sector in the sector bitmap 90*b* corresponding to a cluster including an updated sector is changed. However, when the sector bitmap 90*b* of a relevant entry changes to all "0" (all sectors are valid) at a point when the bitmap is changed, this entry is deleted from the bad cluster table 90. According to this processing, it is possible to prevent the size of the bad cluster table 90 from becoming unnecessarily large. When the entry itself is not present, it is possible to determine that a cluster of attention is valid without checking the content of the sector bitmap 90*b*. This leads to an increase in speed of processing and efficiency of the write processing.

Write_FUA Processing

Concerning a Write request that does not involve flushing from the WC 21 to the NAND memory 10, notification of the end of the write processing is notified to the host apparatus 1 at a pint when data is written in the WC 21. Therefore, when a power supply failure or the like occurs at this point, data in the WC 21 is lost. Therefore, Write_FUA may be used as processing for returning the notification of the end of the write processing to the host apparatus 1 at a point when data from the host apparatus 1 is written in the NAND memory 10 from the WC 21. In such Write_FUA, unless the data from the host apparatus 1 written in the WC 21 is quickly written in the NAND memory 10, loss of data is not prevented when a power supply failure occurs. Therefore, when Write_FUA processing is performed, the data from the host apparatus 1 may be written in the NAND memory 10 via the RC 22.

FIG. 25 is a diagram for explaining the Write_FUA processing performed by the memory system according to this embodiment. When a Write_FUA request (a forced write command for writing in the NAND memory 10) is sent from the host apparatus 1 to the SSD 100 shown in FIG. 1 (the processor 104 shown in FIGS. 3 and 25), the processor 104 writes data designated by the Write_FUA request in the RC 22 from the host apparatus 1. The data written in the RC 22 is further written in the NAND memory 10.

As in normal Write processing (Write other than Write_FUA), when data designated by a Write request is written in the NAND memory 10 from the host apparatus 1 via the WC 21, to secure an area of the DRAM 20, determination, processing, and the like of flushing of data from the WC 21 to the NAND memory 10 are performed. Further, for example, complicated update processing for the management table is performed.

On the other hand, the data stored in the RC 22 is data already read out by the host apparatus 1. Therefore, the data stored in the RC 22 is data that can be overwritten without being flushed to the NAND memory 10 or erased.

In this embodiment, the data designated by the Write_FUA request is written in the NAND memory 10 from the host apparatus 1 via the RC 22. Therefore, flushing and the like of the data stored in the RC 22 are unnecessary and the complicated update processing and the like for the management table are unnecessary.

Figure 26:
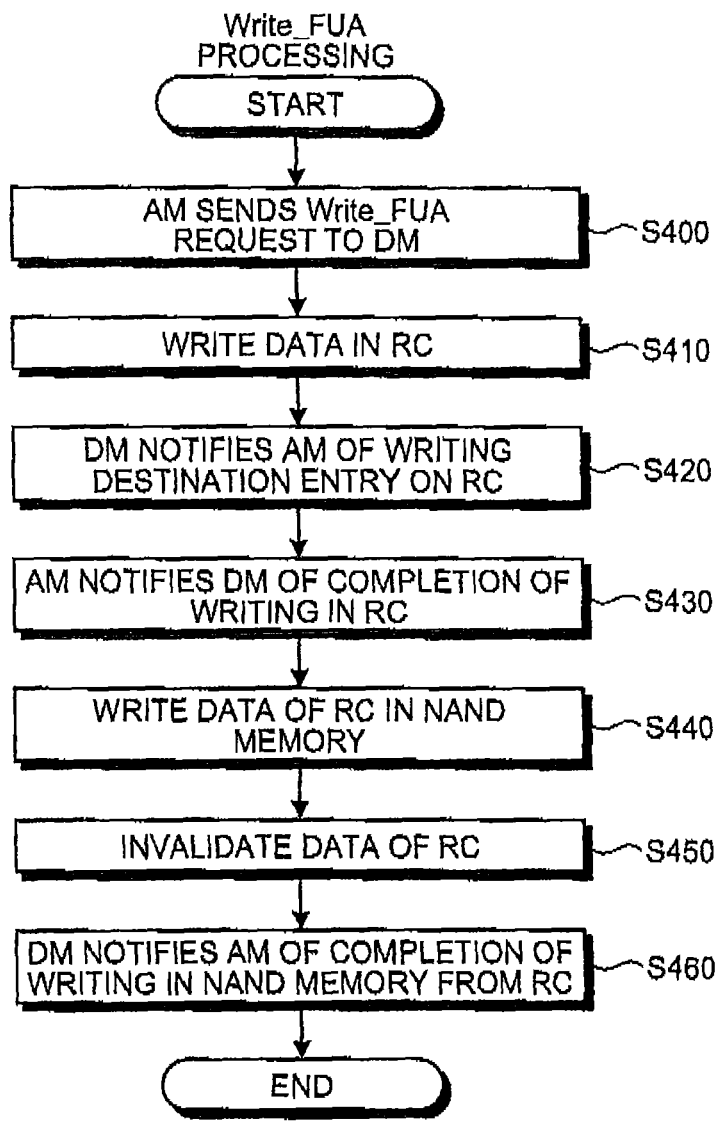
FIG. 26 is a flowchart of a processing procedure of the Write_FUA processing.

FIG. 26 is a flowchart of a processing procedure of the Write_FUA processing performed by the memory system according to this embodiment. In the following explanation, the data managing unit 120 shown FIG. 4 is referred to as DM and the ATA-command processing unit 121 shown in FIG. 4 is referred to as AM.

When a Write_FUA request is sent from the host apparatus 1 to the SSD 100, the AM of the processor 104 sends the Write_FUA request to the DM (step S400). According to the Write_FUA request, the DM writes data designated by the Write_FUA request in the RC 22 (step S410).

The DM sends notification of a write destination entry on the RC 22 to the AM (step S420). When the AM receives the notification of the write destination entry from the DM, the AM sends notification of completion of writing in the entry to the DM (step S430).

Thereafter, the DM writes the data from the host apparatus 1, which is stored in the RC 22, in the NAND memory 10 (step S440). When the Write_FUA request is received from the host apparatus 1 in this way, processing for writing the data in a buffer (the RC 22) on the DRAM 20 for only a moment and immediately writing the data in the NAND memory 10 is performed. In other words, when the Write_FUA request is received from the host apparatus 1, the RC 22 is temporarily used as a buffer for FUA writing.

When the data is written in the NAND memory 10, the DM invalidates the data on the RC 22 written in the NAND memory 10 (the entry used for writing) (step S450). The DM notifies the AM that the data writing in the NAND memory 10 from the entry is completed (step S460).

When the SSD 100 writes data of the host apparatus 1 in the NAND memory 10 in Write processing, the SSD 100 writes the data in the entry on the WC 21. When the SSD 100 reads out data requested by the host apparatus 1 in Read processing, the SSD 100 searches through an entry (a cluster entry) on the WC 21. When there is no hit in the entry on the WC 21, relevant data is read out from the NAND memory 10 to the RC 22. When data in the same logical address are present in both the WC 21 and the RC 22, the data on the WC 21 is likely to be newer than the data on the NAND memory 10. Therefore, the RC 22 is not used and the data is directly read out from the WC 21.

On the other hand, in the Write_FUA processing, a data area temporarily written in the DRAM 20 is the RC 22. However, data in a logical address desired to be written according to a Write_FUA command may be present on the WC 21 because of a Write command executed before the Write_FUA command. In other words, valid data newer than the data on the NAND memory 10 (latest data) may be stored on the WC 21.

Data of one cluster (continuous predetermined number of sectors) is stored in one entry of the WC 21. Therefore, for example, when the size of data written by the Write_FUA processing is one sector, to form data of one cluster as a minimum data management unit on the NAND memory 10, the intra-cluster sector padding is necessary.

Considering such supplementary work, when data in the same logical address as the data (the cluster) for which a Write_FUA request is received from the host apparatus 1 is already present on the WC 21, it is more efficient to write the data in the entry of the WC 21. Further, it is possible to guarantee that the data present on the WC 21 is the latest data even after the data on the RC 22 is written in the NAND memory 10. Therefore, when a cluster entry corresponding to a logical address range designated by the Write_FUA processing is present on the WC 21, the DM executes an operation for writing data in the entry of the WC 21.

When the Write_FUA processing is performed in this way, data is written in the NAND memory 10 via the RC 22. Therefore, flushing and the like of the data stored in the DRAM 20 are unnecessary and the complicated update processing and the like for the management table are unnecessary. Consequently, when the Write_FUA processing is performed, it is possible to write data in the NAND memory 10 in a short time. Therefore, regardless of a state of the WC 21, it is possible to guarantee fixed latency with respect to the processing for writing data in the NAND memory 10 from the host apparatus 1.

When the Write_FUA request is received from the host apparatus 1, because data is written in the NAND memory 10 via the RC 22, it is unnecessary to secure a buffer area exclusively for FUA in the DRAM 20. Therefore, it is possible to efficiently use the DRAM 20. When data for which the Write_FUA request is received from the host apparatus 1 is already present on the WC 21, data is written in the entry of the WC 21. Therefore, it is possible to efficiently perform data writing.

Switching of an Operation Mode

In this embodiment, an operation mode of the data managing unit 120 (the SSD 100) is switched based on the bad cluster table 90, the bad block management table 200, and the like. For example, an upper limit value is set for the size of the bad cluster table 90. When the number of remaining entries of the bad cluster table 90 decreases to be equal to or smaller than a predetermined number (a first threshold), the data managing unit 120 shift to a WB mode explained later and operates. When the number of remaining entries of the bad cluster table 90 decreases to be equal to or smaller than a predetermined number (a second threshold), the data managing unit 120 shifts to an RD only mode explained later and operates.

For example, an upper limit value is set for the size of the BB management table 200. When the number of remaining entries of the BB management table 200 decreases to be equal to or smaller than a predetermined number (a third threshold), the data managing unit 120 shifts to the WB mode explained later and operates. When the number of remaining entries of the BB management table 200 decreases to be equal to or smaller than a predetermined number (a fourth threshold), the data managing unit 120 shifts to the RD only mode explained later and operates.

Figure 27:
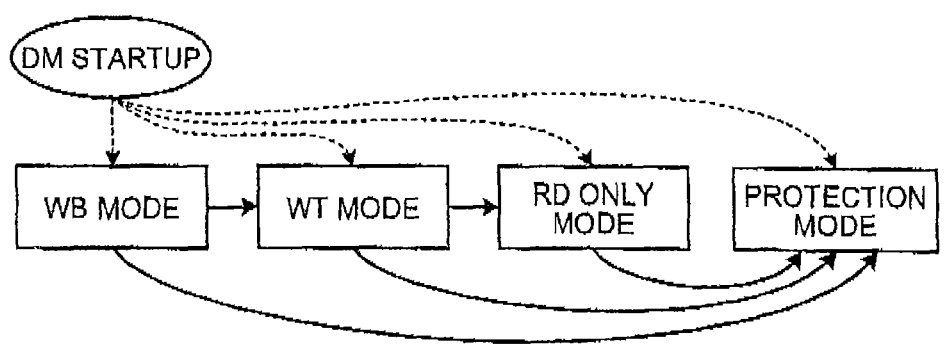
FIG. 27 is a diagram for explaining operation modes of the data managing unit.

Operation modes of the data managing unit 120 include a write back mode (a WB mode), a write through mode (a WT mode), a read only node (an RD only mode), and a protection mode. The data managing unit 120 shifts as shown in FIG. 27. A solid line shown in FIG. 27 indicates shift during an operation. A dotted line shown in FIG. 27 indicates shift during startup.

The WB mode is a normal operation mode for writing data in the WC 21 once and flushing the data to the NAND memory 10 based on a predetermined condition. The WT mode is an operation mode for writing data, which is written in the WC 21 (the RC 22) according to one write request, in the NAND memory 10 every time a Writ request is received. The RD only mode is a mode for prohibiting all kinds of processing involving writing in the NAND memory 10.

WB Mode

As explained above, data written according to the Write command is always stored on the WC 21 once and then written in the NAND memory 10 according to a condition. In write processing, it is likely that flushing processing and compaction processing are performed. In this embodiment, the write processing is roughly divided into two stages of write cache flush processing (hereinafter, "WCF processing") and clean input buffer processing (hereinafter, "CIB processing") (see FIG. 19). The WB mode is a normal operation mode. The AM (the ATA-command processing unit 121) performs a standard processing operation.

WT Mode

When it is necessary to shift from the WB mode to the WT mode, the data managing unit 120 notifies the ATA-command processing unit 121 that the data managing unit 120 shifts to the WT mode. The ATA-command processing unit 121 receives the notification from the data managing unit 120, replaces all Write requests from the host apparatus 1 with WRITE_FUA, and issues the Write request. The WT mode is an operation mode used for guaranteeing data written from the host apparatus 1 as much as possible when the SSD 110 is close to the durable life thereof. In the case of the WT mode, the AM performs data writing according to a Write_FUA request instead of a normal Write request when data requested by the host apparatus 1 is written. Processing for the Write_FUA request can be performed through the WC 21 as in the normal Write processing or can be performed through the RC 22 as explained above. When the data managing unit 120 shifts to the WT mode once, the data managing unit 120 continues the processing in the WT mode until reset or until the power supply is turned off or further shifts to the RD only mode. Immediately after the reset or immediately after the power supply is turned on, an internal state of the data managing unit 120 is always inspected. When a condition is satisfied, the data managing unit 120 is started in the WT mode again.

Conditions for the data managing unit 120 to shift to the WT mode are as explained below.

The number of remaining entries of the bad cluster table 90 decreases to be equal to or smaller than the predetermined value (the first threshold) (determination by the logical-NAND-layer managing unit 120*b*).

The number of remaining entries of the bad block management table 200 decreases to be equal to or smaller than the predetermined value (the third threshold) (determination by the physical-NAND-layer managing unit 120*c*).

When any one of these conditions is satisfied, the data managing unit 120 shifts from the WB mode to the WT mode. Because the data managing unit 120 shifts to the WT mode in this way, it is possible to write requested data in the NAND memory 10 every time writing is requested. Consequently, even in the SSD 100 in an exhausted state in which the number of bad clusters or the number of bad blocks BB tends to increase, data writing does not suddenly become impossible and it is possible to guarantee data writing in the NAND memory 10 up to a predetermined amount. RD only mode When a condition for shift from the WT mode to the RD only mode is satisfied, the data managing unit 120 does not start processing for a Write request and returns an error clearly describing that data cannot be received because the data managing unit 120 is in the RD only mode. The RD only mode is an operation mode used for guaranteeing data already written from the host apparatus 1 as much as possible when the SSD 100 is close to the durable life thereof. In the case of the RD only mode, the AM returns an error without requesting the DM to perform write processing for data requested by the host apparatus 1. When the data managing unit 120 shifts to the RD only mode once, the data managing unit 120 continues processing in the RD only mode until reset or until the power supply is turned off. Immediately after the reset or immediately after the power supply is turned on, an internal state of the data managing unit 120 is always inspected. When a condition is satisfied, the data managing unit 120 is started in the RD only mode again.

Conditions for the data managing unit 120 to shift to the RD only mode are as explained below.

The number of remaining entries of the bad cluster table 90 decreases to be equal to or smaller than the predetermined value (the second threshold, e.g., 0) (determination by the logical-NAND-layer managing unit 120*b*).

The number of remaining entries of the BB management table 200 decreases to be equal to or smaller than the predetermined value (the fourth threshold, e.g., 0) (determination by the physical-NAND-layer managing unit 120*c*).

Free blocks FB are insufficient (determination by the logical-NAND-layer managing unit 120*b*)

The free blocks FB are insufficient, for example, when a free block FB cannot be formed even if compaction processing is performed and the number of logical blocks in the MS 11 is over a specified number. Specifically, this indicates a state in which there is no area for writing in the NAND memory 10.

When any one of the four conditions is satisfied, the data managing unit 120 shifts from the WT mode to the RD only mode. When the four conditions are satisfied, the data managing unit 120 returns an error responding to a Write request involving writing in the NAND memory 10. In other words, when data writing in the NAND memory 10 cannot be guaranteed, the data managing unit 120 performs error processing without receiving a data writing request.

When data from the host apparatus 1 is written in the NAND memory 10, a bad block BB and a bad cluster may occur. In such a case, if the back block BB and the bad cluster cannot be correctly registered in the BB management table 200 and the bad cluster table 90, the bad block BB and the bad cluster cannot be correctly managed. Therefore, if writing of new data is permitted when any one of the four conditions is satisfied, a situation in which the bad block BB and the bad cluster cannot be correctly managed may occur. In this embodiment, when it is likely that a situation in which the bad block BB and the bad cluster cannot be correctly registered in the BB management table 200 and the bad cluster table 90 occurs, the data managing unit 120 shifts to the RD only mode to prohibit data writing in the NAND memory 10. Therefore, the situation in which the bad block BB and the bad cluster cannot be correctly managed does not occur.

Protection Mode

The data managing unit 120 restores, during task startup, a state immediately before power-off referring to a log or the like. When a block in which the log is stored cannot be read out because of an L2-ECC error, the data managing unit 120 considers that initialization fails, sets an error flag, and returns an initialization completion notification message to the initialization managing unit 124. In the protection mode, it is conceivable to perform operation restriction, for example, prohibit access from the host apparatus 1 or return an error message to protect internal data not to be broken.

In this way, according to this embodiment, the operation mode of the data managing unit 120 is switched based on the bad cluster table 90 and the bad block management table 200. Therefore, even when back blocks BB and back cluster increase, it is possible to perform data writing efficiently using the area of the NAND memory 10. Therefore, data writing does not become impossible regardless of the fact that there is a free capacity in the NAND memory 10.

When the predetermined condition is satisfied, the data managing unit 120 shifts to the RD only mode. Therefore, it is possible to correctly manage the bad block BB and the back cluster.

The data managing unit 120 determines, based on the bad cluster table 90 and the bad block management table 200, an operation mode to be switched. Therefore, it is possible to easily and quickly switch the operation mode.

In this embodiment, the WB mode, the WT mode, the RD only mode, and the protection mode are explained. However, all the operation modes do not always have to be set in the SSD 100. For example, the data managing unit 120 can shift from the WB mode to the RD only mode and the protection mode not through the WT mode.

In this embodiment, the operation mode is changed according to the threshold set based on both the bad cluster table 90 and the BB management table 200. However, the change of the operation mode can be controlled by using only one of the tables.

In this embodiment, the error correction is performed stepwise by the two ECC circuits, the first ECC circuit 112 and the second ECC circuit 118. However, the error correction in two stages does not always need to be performed. For example, when one ECC circuit fails in the error correction, a cluster in which the error occurs can be registered in the bad cluster table.

The present invention is not limited to the embodiments described above. Accordingly, various modifications can be made without departing from the scope of the present invention.

Furthermore, the embodiments described above include various constituents with inventive step. That is, various modifications of the present invention can be made by distributing or integrating any arbitrary disclosed constituents.

For example, various modifications of the present invention can be made by omitting any arbitrary constituents from among all constituents disclosed in the embodiments as long as problem to be solved by the invention can be resolved and advantages to be attained by the invention can be attained.

Furthermore, it is explained in the above embodiments that a cluster size multiplied by a positive integer equal to or larger than two equals to a logical page size. However, the present invention is not to be thus limited.

For example, the cluster size can be the same as the logical page size, or can be the size obtained by multiplying the logical page size by a positive integer equal to or larger than two by combining a plurality of logical pages.

Moreover, the cluster size can be the same as a unit of management for a file system of OS (Operating System) that runs on the host apparatus 1 such as a personal computer.

Furthermore, it is explained in the above embodiments that a track size multiplied by a positive integer equal to or larger than two equals to a logical block size. However, the present invention is not to be thus limited.

For example, the track size can be the same as the logical block size, or can be the size obtained by multiplying the logical block size by a positive integer equal to or larger than two by combining a plurality of logical blocks.

If the track size is equal to or larger than the logical block size, MS compaction processing is not necessary. Therefore, the TFS 11*b* can be omitted.

Second Embodiment

Figure 28:
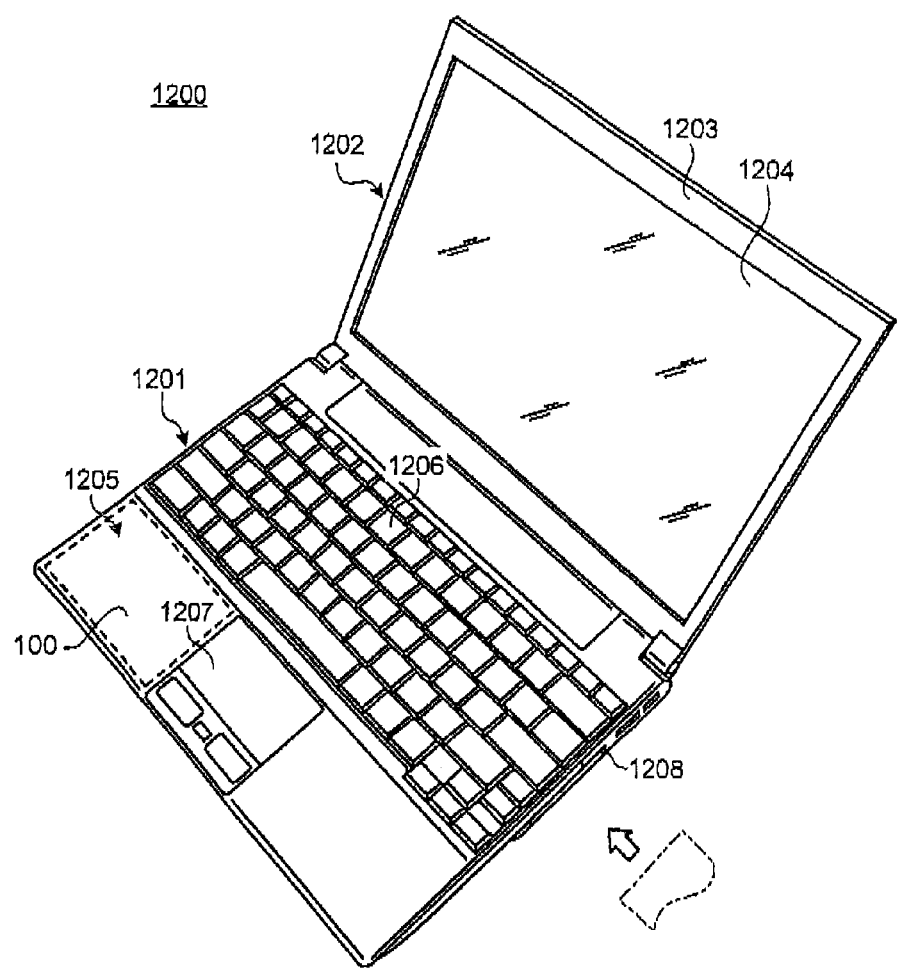
FIG. 28 is a perspective view of an example of a personal computer mounted with the SSD.

FIG. 28 shows a perspective view of an example of a personal computer. A personal computer 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes a main circuit board, an ODD unit (Optical Disk Device), a card slot, and the SSD 1100 described in the first embodiment.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 1100 may be used instead of the prior art HDD in the state of being mounted in the personal computer 1200 or may be used as an additional device in the state of being inserted into the card slot of the personal computer 1200.

Figure 29:
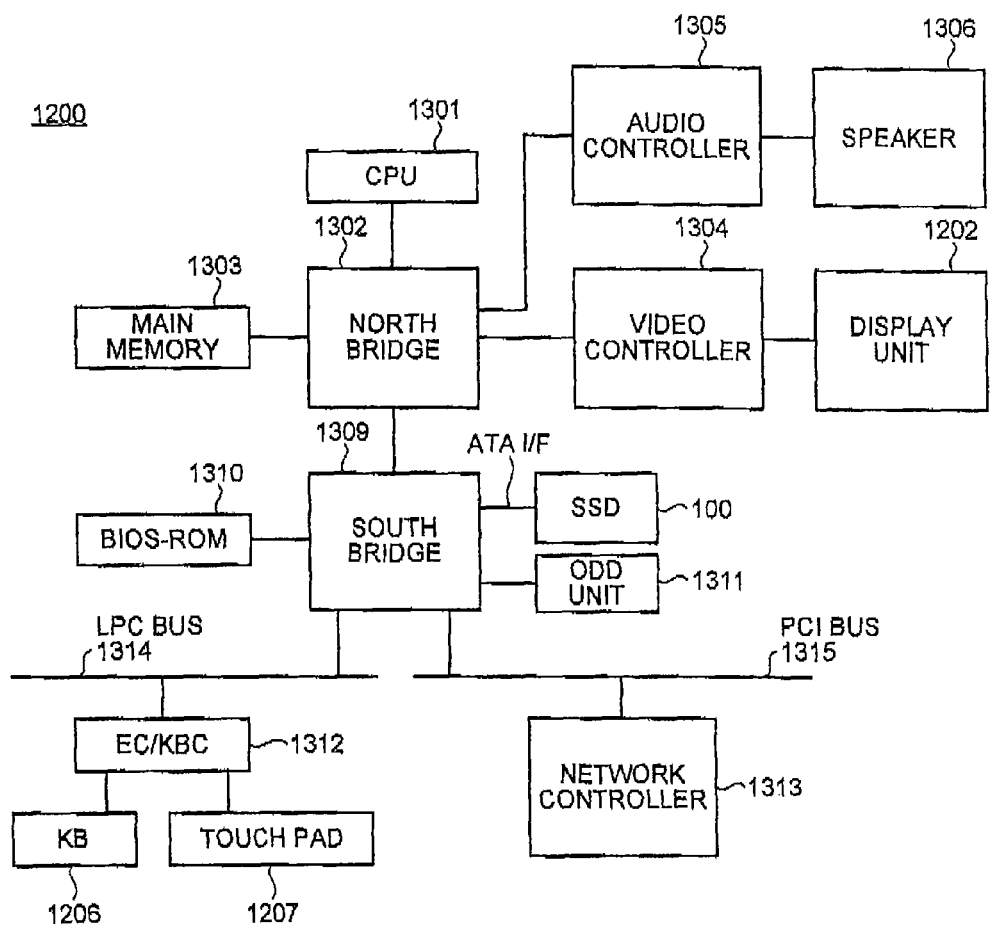
FIG. 29 is a diagram of a system configuration example of the personal computer mounted with the SSD.

FIG. 29 shows a diagram of an example of system architecture in a personal computer. The personal computer 1200 is comprised of CPU 1301, a north bridge 1302, a main memory 1303, a video controller 1304, an audio controller 1305, a south bridge 1309, a BIOS-ROM 1310, the SSD 1100 described in the first embodiment, an ODD unit 1311, an embedded controller/keyboard controller (EC/KBC) IC 1312, and a network controller 1313.

The CPU 1301 is a processor for controlling an operation of the personal computer 1200, and executes an operating system (OS) loaded from the SSD 1100 to the main memory 1303. The CPU 1301 executes these processes, when the ODD unit 1311 executes one of reading process and writing process to an optical disk. The CPU 1301 executes a system BIOS (Basic Input Output System) stored in the BIOS-ROM 1310. The system BIOS is a program for controlling a hard ware of the personal computer 1200.

The north bridge 1302 is a bridge device which connects the local bus of the CPU 1301 to the south bridge 1309. The north bridge 1302 has a memory controller for controlling an access to the main memory 1303. The north bridge 1302 has a function which executes a communication between the video controller 1304 and the audio controller 1305 through the AGP (Accelerated Graphics Port) bus.

The main memory 1303 stores program or data temporary, and functions as a work area of the CPU 1301. The main memory 1303 is comprised of, for example, DRAM. The video controller 1304 is a video reproduce controller for controlling a display unit which is used for a display monitor (LCD) 1316 of the portable computer 1200. The Audio controller 1305 is an audio reproduce controller for controlling a speaker of the portable computer 1200.

The south bridge 1309 controls devices connected to the LPC (Low Pin Count) bus, and controls devices connected to the PCI (Peripheral Component Interconnect) bus. The south bridge 1309 controls the SSD 1100 which is a memory device stored soft ware and data, through the ATA interface.

The personal computer 1200 executes an access to the SSD 1100 in the sector unit. For example, the write command, the read command, and the cache flash command are input through the ATA interface. The south bridge 1309 has a function which controls the BIOS-ROM 1310 and the ODD unit 1311.

The EC/KBC 1312 is one chip microcomputer which is integrated on the embedded controller for controlling power supply, and the key board controller for controlling the key board (KB) 1206 and the touch pad 1207. The EC/KBC 1312 has a function which sets on/off of the power supply of the personal computer 1200 based on the operation of the power button by user. The network controller 1313 is, for example, a communication device which executes the communication to the network, for example, the internet.

Although the memory system in the above embodiments is comprised as an SSD, it can be comprised as, for example, a memory card typified by an SD™ card. Moreover, the memory system can be applied not only to a personal computer but also to various electronic devices such as a cellular phone, a PDA (Personal Digital Assistant), a digital still camera, a digital video camera, and a television set.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
   a nonvolatile memory including a plurality of blocks; and
   a controller configured to count a number of bad blocks in the nonvolatile memory, wherein,
   in a case that the number of counted bad blocks in the nonvolatile memory has reached a first threshold, a warning indication is issued,
   in a case that the number of counted bad blocks in the nonvolatile memory has reached a second threshold, a data write operation to the nonvolatile memory is prohibited, the first threshold being less than the second threshold, wherein,
   immediately after power is turned on and before the memory system is started, the controller inspects an internal state of the controller and refers to the number of counted bad blocks in the nonvolatile memory, and in a case that the number of counted bad blocks in the nonvolatile memory has reached the second threshold, the controller controls the nonvolatile memory so that the nonvolatile memory is started in a read only mode.

2. The system according to claim 1, wherein, when an error occurs in the nonvolatile memory, the system shifts to a failure mode.

3. The system according to claim 1, wherein, when the system is powered on, the number of bad blocks is counted and compared with at least one of the first threshold and the second threshold.

4. The system according to claim 2, wherein, when the system shifts to the failure mode, the system displays an error message.

5. The system according to claim 1, further comprising a light emitting diode (an LED) indicating a status of the system.

6. The system according to claim 1, further comprising a temperature sensor monitoring a temperature of at least one of the nonvolatile memory and the controller.

7. The system according to claim 1, wherein, when the number of counted bad blocks is between the first threshold and the second threshold, data can be moved to backup.

8. The system according to claim 1, wherein, after the number of counted bad blocks has reached the second threshold, data can be moved to backup.

9. The system according to claim 2, wherein, after the system has shifted to the failure mode, data cannot be moved to backup.

10. The system according to claim 1, wherein logical addresses are translated to physical addresses of the nonvolatile memory.

11. A system comprising:
a nonvolatile memory including a plurality of blocks; and
a controller configured to count a reserve capacity in the nonvolatile memory, wherein,
in the case that the counted reserve capacity in the nonvolatile memory has reached a first threshold, a warning indication is issued,
after the counted reserve capacity in the nonvolatile memory has reached a second threshold, a data write operation to the nonvolatile memory is prohibited, the first threshold being less than the second threshold, wherein,
immediately after power is turned on and before the memory system is started, the controller inspects an internal state of the controller and refers to the counted reserve capacity in the nonvolatile memory,
in the case that the counted reserve capacity in the nonvolatile memory has reached the second threshold, the system controls the nonvolatile memory so that the nonvolatile memory is started in a read only mode.

12. The system according to claim 11, wherein, when an error occurs in the nonvolatile memory, the system shifts to a failure mode.

13. The system according to claim 11, wherein, when the system is powered on, the reserve capacity is counted and compared with at least one of the first threshold and the second threshold.

14. The system according to claim 12, wherein, when the system shifts to the failure mode, the system displays an error message.

15. The system according to claim 11, further comprising a light emitting diode (an LED) indicating status of the system.

16. The system according to claim 11, further comprising a temperature sensor monitoring a temperature of at least one of the nonvolatile memory and the controller.

17. The system according to claim 11, wherein, when the counted reserve capacity is between the first threshold and the second threshold, data can be moved to backup.

18. The system according to claim 11, wherein, after the counted reserve capacity has reached the second threshold, data can be moved to backup.

19. The system according to claim 12, wherein, after the system has shifted to the failure mode, data cannot be moved to backup.

20. The system according to claim 11, wherein logical addresses are translated to physical addresses of the nonvolatile memory.

21. A memory system comprising:
a nonvolatile memory including a plurality of blocks; and
a controller configured to count a number of bad blocks in the nonvolatile memory, wherein,
in a case that the number of counted bad blocks has reached a first threshold, a warning indication is issued,
in a case that the number of counted bad blocks has reached a second threshold, the first threshold being less than the second threshold, wherein a data write operation to the nonvolatile memory is prohibited, and immediately after power is turned on and before the memory system is started, the controller inspects an internal state of the controller and refers to the number of counted bad blocks and controls the nonvolatile memory so that the nonvolatile memory is started in a read only mode.

22. A system comprising:
a nonvolatile memory including a plurality of blocks; and
a controller configured to count a reserve capacity in the nonvolatile memory, wherein,
in the case that the counted reserve capacity in the nonvolatile memory has reached a first threshold, a warning indication is issued,
after the counted reserve capacity in the nonvolatile memory has reached a second threshold, a data write operation to the nonvolatile memory is prohibited, wherein,
immediately after power is turned on and before the memory system is started, the controller inspects an internal state of the controller and refers to the counted reserve capacity in the nonvolatile memory,
in the case that the counted reserve capacity in the nonvolatile memory has reached the second threshold, the system controls the nonvolatile memory so that the nonvolatile memory is started in a read only mode.

23. A memory system comprising:
a nonvolatile memory including a plurality of blocks; and
a controller configured to count a number of bad blocks in the nonvolatile memory, wherein,
in a case that the number of counted bad blocks in the nonvolatile memory has reached a threshold, a data write operation to the nonvolatile memory is prohibited, wherein,
after power is supplied from a host and the memory system is turned on, and before receiving a write command from the host, the controller refers to the number of counted bad blocks in the nonvolatile memory, and in a case that the number of counted bad blocks in the nonvolatile memory has reached the threshold, the controller controls the nonvolatile memory so that the nonvolatile memory is started in a read only mode.

24. The system according to claim 23, wherein
the controller refers to the number of counted bad blocks in the nonvolatile memory before processing the write command from the host.

25. The system according to claim 23, wherein,
in a case that the number of counted bad blocks in the nonvolatile memory exceeds a second threshold, the controller causes the host to issue a warning indication, the second threshold being less than the threshold.

26. The system according to claim 24, wherein
the controller includes a host interface circuit that receives the write command from the host.

27. The system according to claim 26, wherein
the nonvolatile memory is a NAND, and
the controller includes a NAND interface circuit that writes data in the NAND, and the controller checks, before the NAND interface circuit processes the write command, whether the NAND has been shifted to the read only mode in the past.

28. The system according to claim 26, wherein
the nonvolatile memory is a NAND, and
the controller writes data in the NAND in page units, and the controller erases data from the NAND in block units.

29. A memory system comprising:
a nonvolatile memory including a plurality of blocks; and
a controller configured to count a number of bad blocks in the nonvolatile memory, wherein,
in a case that the number of counted bad blocks in the nonvolatile memory has reached a threshold, a data write operation to the nonvolatile memory is prohibited, wherein, after the memory system is restarted and before receiving a write command from a host, the controller refers to the number of counted bad blocks in the nonvolatile memory, and in a case that the number of counted bad blocks in the nonvolatile memory has reached the threshold, the controller controls the nonvolatile memory so that the nonvolatile memory is started in a read only mode.

30. The system according to claim 29, wherein the controller refers to the number of counted bad blocks in the nonvolatile memory before processing the write command from the host.

31. The system according to claim 29, wherein, in a case that the number of counted bad blocks in the nonvolatile memory exceeds a second threshold, the controller causes the host to issue a warning indication, the second threshold being less than the threshold.

32. The system according to claim 30, wherein the controller includes a host interface circuit that receives the write command from the host.

33. The system according to claim 32, wherein the nonvolatile memory is a NAND, and the controller includes a NAND interface circuit that writes data in the NAND, and the controller checks, before the NAND interface circuit processes the write command, whether the NAND has been shifted to the read only mode in the past.

34. The system according to claim 32, wherein the nonvolatile memory is a NAND, and the controller writes data in the NAND in page units, and the controller erases data from the NAND in block units.

35. A memory system comprising:
a nonvolatile memory including a plurality of blocks; and
a controller configured to count a number of bad blocks in the nonvolatile memory, wherein,
in a case that the number of counted bad blocks in the nonvolatile memory has reached a threshold, a warning indication is issued, and after the warning is issued, a data write operation to the nonvolatile memory is prohibited, wherein,
after restarting power supply from a host, the controller refers to the number of counted bad blocks in the nonvolatile memory, and in a case that the number of counted bad blocks in the nonvolatile memory has reached the threshold, the controller controls the nonvolatile memory so that the nonvolatile memory is started in a read only mode.

36. The system according to claim 35, wherein the controller refers to the number of counted bad blocks in the nonvolatile memory before processing a write command from the host.

37. The system according to claim 35, wherein, in a case that the number of counted bad blocks in the nonvolatile memory exceeds a second threshold, the controller causes the host to issue a warning indication, the second threshold being less than the threshold.

38. The system according to claim 36, wherein the controller includes a host interface circuit that receives the write command from the host.

39. The system according to claim 38, wherein the nonvolatile memory is a NAND, and the controller includes a NAND interface circuit that writes data in the NAND, and the controller checks, before the NAND interface circuit processes the write command, whether the NAND has been shifted to the read only mode in the past.

40. The system according to claim 38, wherein the nonvolatile memory is a NAND, and the controller writes data in the NAND in page units, and the controller erases data from the NAND in block units.

41. A memory system comprising:
a nonvolatile memory including a plurality of blocks; and
a controller configured to refer a number of errors in the nonvolatile memory, wherein,
in a case that the number of the errors in the nonvolatile memory has reached a threshold, a warning indication is issued, and after the warning is issued, a data write operation to the nonvolatile memory is prohibited, wherein,
after restarting power supply from a host and the memory system is turned on, and before receiving a write command from the host, the controller controls the nonvolatile memory so that the nonvolatile memory is started in a read only mode.

42. The system according to claim 41, wherein the error is an error in a case that an erasing operation failed.

43. The system according to claim 42, wherein the controller refers to the number of errors in the nonvolatile memory before processing the write command from the host.

44. The system according to claim 42, wherein, in a case that the number of errors in the nonvolatile memory exceeds a second threshold, the controller causes the host to issue a warning indication, the second threshold being less than the threshold.

45. The system according to claim 43, wherein the controller includes a host interface circuit that receives the write command from the host.

46. The system according to claim 45, wherein the nonvolatile memory is a NAND, and the controller includes a NAND interface circuit that writes data in the NAND, and the controller checks, before the NAND interface circuit processes the write command, whether the NAND has been shifted to the read only mode in the past.

47. The system according to claim 45, wherein the nonvolatile memory is a NAND, and the controller writes data in the NAND in page units, and the controller erases data from the NAND in block units.

* * * * *